US012795986B2

(12) United States Patent
Ishida et al.

(10) Patent No.: US 12,795,986 B2
(45) Date of Patent: Nov. 10, 2026

(54) SEMICONDUCTOR DEVICE AND METHOD FOR MANUFACTURING SAME

(71) Applicant: ROHM CO., LTD., Kyoto (JP)

(72) Inventors: Takeshi Ishida, Kyoto (JP); Yasushi Hamazawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 829 days.

(21) Appl. No.: 17/909,813

(22) PCT Filed: Mar. 3, 2021

(86) PCT No.: PCT/JP2021/008177
§ 371 (c)(1),
(2) Date: Sep. 7, 2022

(87) PCT Pub. No.: WO2021/182236
PCT Pub. Date: Sep. 16, 2021

(65) Prior Publication Data
US 2024/0204099 A1 Jun. 20, 2024

(30) Foreign Application Priority Data
Mar. 13, 2020 (JP) ................................ 2020-044369

(51) Int. Cl.
*H10D 30/65* (2025.01)
*H10D 30/01* (2025.01)
*H10D 62/10* (2025.01)

(52) U.S. Cl.
CPC ......... *H10D 30/65* (2025.01); *H10D 30/0281* (2025.01); *H10D 62/102* (2025.01)

(58) Field of Classification Search
CPC .. H10D 30/65; H10D 30/0281; H10D 30/021; H10D 30/0221; H10D 30/60;
(Continued)

(56) References Cited

U.S. PATENT DOCUMENTS 4,873,564 A * 10/1989 Beasom ................ H10D 62/60
257/524
5,264,719 A * 11/1993 Beasom .............. H10D 62/109
257/E29.066

(Continued)

FOREIGN PATENT DOCUMENTS

JP 2002-314066 A 10/2002
JP 2003258113 A 9/2003

(Continued)

OTHER PUBLICATIONS

International Search Report for PCT/JP2021/008177, mailed on Jun. 8, 2021.

(Continued)

*Primary Examiner* — Mohsen Ahmadi
(74) *Attorney, Agent, or Firm* — Rabin & Berdo. P.C.

(57) ABSTRACT

A semiconductor device 1 includes a p type substrate 4, an n type semiconductor layer 5 that is formed on the p type substrate, and a transistor 40 with the n type semiconductor layer as a drain, the transistor includes a p type well region 15 that is formed in a surface layer portion of the n type semiconductor layer and has an n type source contact region in a surface layer portion thereof and an n type drain contact region 14 that is formed in the surface layer portion of the n type semiconductor layer and is disposed at an interval from the p type well region 15, and, inside the n type semiconductor layer, a p type embedded layer 10 is formed below the p type well region.

14 Claims, 22 Drawing Sheets

(58) Field of Classification Search
CPC .. H10D 30/603; H10D 62/102; H10D 62/151; H10D 62/371
See application file for complete search history.

(56) References Cited

U.S. PATENT DOCUMENTS

| | | | | |
|---|---|---|---|---|
| 6,207,994 | B1 * | 3/2001 | Rumennik | H10D 30/603 257/E29.054 |
| 2006/0180862 | A1 * | 8/2006 | Nitta | H10D 30/0221 257/E29.279 |
| 2008/0203496 | A1 * | 8/2008 | Takahashi | H10D 30/65 257/E29.027 |
| 2009/0127637 | A1 * | 5/2009 | Akiyama | H10D 30/603 438/455 |
| 2010/0163987 | A1 * | 7/2010 | Nakagawa | H10D 30/657 257/341 |
| 2016/0351704 | A1 * | 12/2016 | Duan | H10D 30/65 |

FOREIGN PATENT DOCUMENTS

| | | | |
|---|---|---|---|
| JP | 2003-332570 | A | 11/2003 |
| JP | 2007088334 | A | 4/2007 |
| JP | 2007-180244 | A | 7/2007 |
| JP | 2009-059949 | A | 3/2009 |
| JP | 2010-258355 | A | 11/2010 |
| JP | 2018-011089 | A | 1/2018 |
| WO | 2012/127960 | A1 | 9/2012 |

OTHER PUBLICATIONS

Written Opinion of the International Searching Authority for PCT/JP2021/008177, mailed on Jun. 8, 2021.
Japanese Office Action dated Mar. 13, 2025, in the counterpart Japanese patent application No. 2022-505973.

* cited by examiner

SEMICONDUCTOR DEVICE AND METHOD FOR MANUFACTURING SAME

TECHNICAL FIELD

The present invention relates to a semiconductor device that includes a transistor such as a DMOS (diffused metal oxide semiconductor) transistor, etc., and a method for manufacturing the same.

BACKGROUND ART

Patent Literature 1 discloses a semiconductor device including a p type silicon substrate, an n type epitaxial layer that is formed on the p type silicon substrate, an n type embedded layer that is formed in a boundary portion between the p type silicon substrate and the n type epitaxial layer, and a DMOS transistor with the n type epitaxial layer as a drain.

In Patent Literature 1, the DMOS transistor includes a p type well region that is formed in a surface layer portion of the n type epitaxial layer and has an n type source contact region (n type source region) in a surface region thereof and an n type well region that is formed at an interval from the p type well region in the surface layer portion of the n type epitaxial layer and has an n type drain contact region (n type drain region) in a surface layer portion thereof.

CITATION LIST

Patent Literature

Patent Literature 1: Japanese Patent Application Publication No. 2018-11089

SUMMARY OF INVENTION

Technical Problem

With a semiconductor device in which a DMOS transistor is formed as in the semiconductor device of Patent Literature 1, there is a problem in that when a drain voltage is applied, a potential distribution between the n type source contact region and the n type drain contact region (between source and drain) becomes nonuniform and a localized concentration of electric field occurs between the source and drain.

An object of the present invention is to provide a semiconductor device and a method for manufacturing the same with which a potential distribution between source and drain can be made uniform to improve a withstand voltage.

Solution to Problem

A preferred embodiment of the present invention provides a semiconductor device including a p type substrate, an n type semiconductor layer that is formed on the p type substrate, and a transistor with the n type semiconductor layer as a drain and where the transistor includes a p type well region that is formed in a surface layer portion of the n type semiconductor layer and has an n type source contact region in a surface layer portion thereof and an n type drain contact region that is formed in the surface layer portion of the n type semiconductor layer and is disposed at an interval from the p type well region and, inside the n type semiconductor layer, a p type embedded layer is formed below the p type well region.

With the present arrangement, a potential distribution between source and drain can be made uniform to improve a withstand voltage.

In the preferred embodiment of the present invention, an n type embedded layer that is formed in a boundary portion between the p type substrate and the n type semiconductor layer and is higher in impurity concentration than the n type semiconductor layer is included.

In the preferred embodiment of the present invention, a width of the p type embedded layer is greater than a width of the p type well region and in plan view, both sides of the p type embedded layer project outward from both sides of the p type well region.

In the preferred embodiment of the present invention, the p type embedded layer is disposed separately from the p type well region.

In the preferred embodiment of the present invention, the p type embedded layer is connected to the p type well region.

In the preferred embodiment of the present invention, the p type embedded layer includes a plurality of p type embedded layers that are disposed at intervals in an up/down direction.

In the preferred embodiment of the present invention, the transistor includes an n type source region that is formed in a surface layer portion of the p type well region and is higher in n type impurity concentration than the n type semiconductor region, the n type source contact region that is formed in a surface layer portion of the n type region and is higher in n type impurity concentration than the n type source region, an n type drain region that is disposed at an interval from the p type well region and is higher in n type impurity concentration than the n type semiconductor region, and the n type drain contact region that is formed in a surface layer portion of the n type drain region and is higher in n type impurity concentration than the n type drain region.

In the preferred embodiment of the present invention, the transistor further includes a gate insulating film that is formed such as to cover a channel region between the source contact region and the drain contact region and a gate electrode that is formed on the gate insulating film and opposes the channel region via the gate insulating film.

In the preferred embodiment of the present invention, a source wiring that is electrically connected to the n type source contact region and a drain wiring that is electrically connected to the n type drain contact region are included.

In the preferred embodiment of the present invention, the n type drain region and the n type drain contact region are formed to endless shapes such as to surround the p type well region in plan view.

In the preferred embodiment of the present invention, the p type embedded layer is disposed inside a region that is surrounded by the n type drain contact region in plan view.

In the preferred embodiment of the present invention, a p type impurity concentration of the p type embedded layer is not less than $1.0\times10^{16}$ $cm^{-3}$ and not more than $1.0\times10^{18}$ $cm^{-3}$.

In a preferred embodiment of the present invention, a step of selectively implanting an n type impurity into a front surface of a p type semiconductor substrate and thereafter forming a first n type epitaxial layer on the front surface of the p type semiconductor substrate to form an n type embedded layer that extends across a boundary between the p type semiconductor substrate and the first n type epitaxial layer, a step of selectively implanting a p type impurity into a front surface of the first n type epitaxial layer and thereafter forming a second n type epitaxial layer on the front surface of the first n type epitaxial layer to form a p type embedded layer between the first n type epitaxial layer and the second n type epitaxial layer, a step of forming, in a surface layer portion of the second n type epitaxial layer, a p type well layer that is disposed above the p type embedded layer, and a step of forming, in a surface layer portion of the p type well layer, an n type source contact region that is higher in impurity concentration than the second n type epitaxial layer and forming, in the surface layer portion of the second n type epitaxial layer, an n type drain contact region that is higher in impurity concentration than the second n type epitaxial layer are included.

In the preferred embodiment of the present invention, in the step of forming the p type embedded layer, the p type embedded layer is formed just in a surface layer portion of the first n type epitaxial layer.

In the preferred embodiment of the present invention, in the step of forming the p type embedded layer, the p type embedded layer is formed across a boundary between the first n type epitaxial layer and the second n type epitaxial layer.

In the preferred embodiment of the present invention, a step of forming, on a front surface of the second n type epitaxial layer, a gate insulating film such as to cover a channel region between the source contact region and the drain contact region and a step of forming, on the gate insulating film, a gate electrode that opposes the channel region via the gate insulating film are further included.

The aforementioned as well as yet other objects, features, and effects of the present invention will be made clear by the following description of the preferred embodiments, with reference to the accompanying drawings.

DESCRIPTION OF EMBODIMENTS

Figure 1:
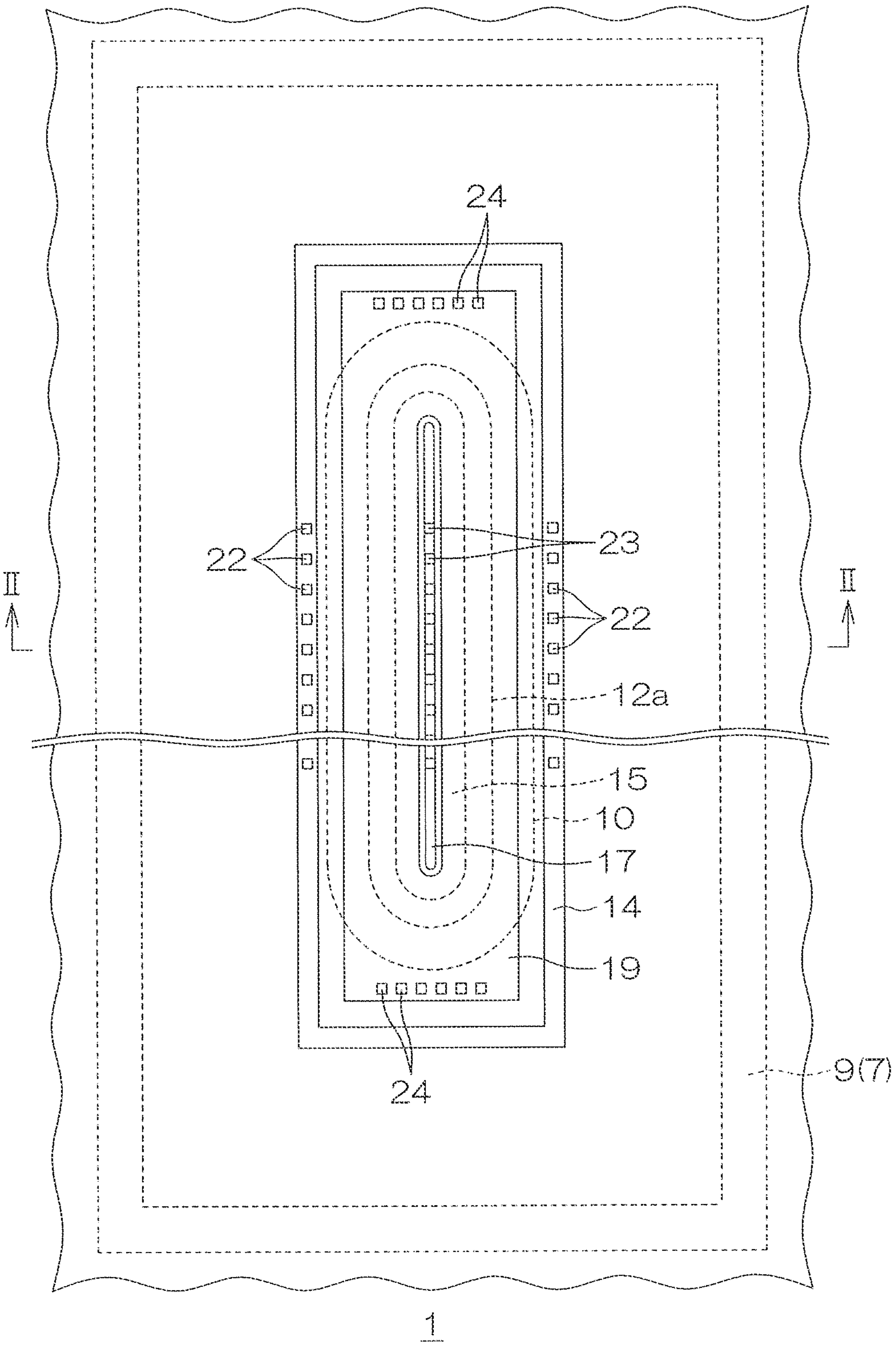
FIG. 1 is an illustrative plan view for describing the arrangement of a semiconductor device according to a first preferred embodiment of the present invention.
Figure 2:
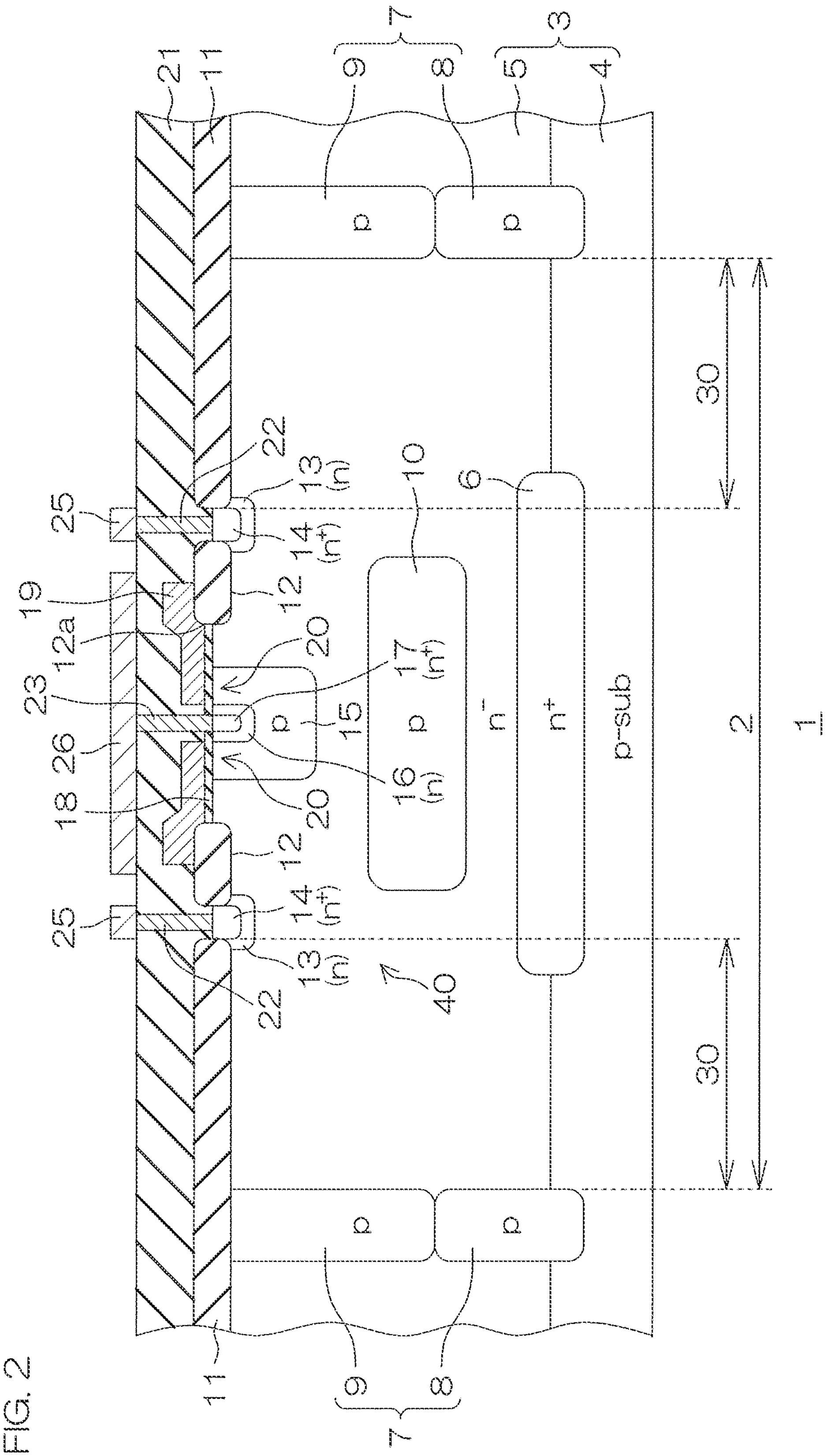
FIG. 2 is an illustrative sectional view taken along line II-II of FIG. 1.

FIG. 1 is an illustrative plan view for describing the arrangement of a semiconductor device according to a first preferred embodiment of the present invention. FIG. 2 is an illustrative sectional view taken along line II-II of FIG. 1. In FIG. 1, an interlayer insulating film 21, a drain wiring 25, and a source wiring 26 shown in FIG. 2 are omitted.

In the following, a right-left direction of the paper surface of FIG. 1 shall be referred to as the lateral direction and an up-down direction of the paper surface of FIG. 1 shall be referred to as the longitudinal direction.

The semiconductor device 1 includes a base body 3. The base body 3 includes a p type semiconductor substrate 4 and an $n^-$ type epitaxial layer 5 that is formed on the p type semiconductor substrate 4. In this preferred embodiment, the p type semiconductor substrate is a silicon substrate. The p type semiconductor substrate 4 is an example of a "p type substrate" of the present invention and the $n^-$ type epitaxial layer 5 is an example of an "n type semiconductor layer" of the present invention.

A film thickness of the $n^-$ type epitaxial layer 5 is, for example, approximately 3.0 μm to 10 μm. A p type element isolation region 7 that demarcates an element region 2 is formed in a surface layer portion of the base body 3. In this preferred embodiment, the element region 2 has a quadrilateral shape that is long in the longitudinal direction in plan view. A DMOS transistor 40 with the $n^-$ type epitaxial layer 5 as a drain is formed in the element region 2.

The p type element isolation region 7 is of endless shape in plan view. Although in this preferred embodiment, the p type element isolation region 7 is of rectangular annular shape in plan view, it may instead be of circular annular shape, elliptical annular shape, or other endless shape. The p type element isolation region 7 includes a lower isolation region 8 that is connected to the p type semiconductor substrate and an upper isolation region 9 that is formed on the lower isolation region 8.

The element region 2 constituted of a portion of the $n^-$ type epitaxial layer 5 that is surrounded by the p type element isolation region 7 on the p type semiconductor substrate 4 is thereby demarcated in the base body 3. Although not illustrated, the p type element isolation region 7 and the p type semiconductor substrate 4 are grounded.

In the element region 2, an $n^+$ type embedded layer 6 that is higher in impurity concentration than the $n^-$ type epitaxial layer 5 is selectively formed across the p type semiconductor substrate 4 and the $n^-$ type epitaxial layer 5 in a boundary portion between the p type semiconductor substrate 4 and the $n^-$ type epitaxial layer 5. The $n^+$ type embedded layer 6 is formed in a central region surrounded by a peripheral edge portion of the element region 2 in plan view. A film thickness of the $n^+$ type embedded layer 6 is, for example, approximately 2.0 μm to 10.0 μm.

Also, in the base body 3, an element region (not shown) in which another element differing from the DMOS transistor 40 inside the element region 2 is formed is demarcated in an outer peripheral region of the element region 2.

A field insulating film 11 of endless shape in plan view is formed on a front surface of the p type element isolation region 7. The field insulating film 11 is formed to a quadrilateral annular shape in plan view such as to surround a region surrounded by the peripheral edge portion of the element region 2. The field insulating film 11 is wider than the p type element isolation region 7 and is formed such as to completely cover the p type element isolation region 7. The field insulating film 11 is, for example, a LOCOS film that is formed by selectively oxidizing a front surface of the $n^-$ type epitaxial layer 5.

The DMOS transistor 40 includes an n type drain region 13 and a p type well region 15 that are formed at an interval from each other in a surface layer portion of the $n^-$ type epitaxial layer 5. In this preferred embodiment, the p type well region 15 is, in plan view, of quadrilateral shape that is elongate in the longitudinal direction and formed in a central portion in the lateral direction of the element region 2.

The n type drain region 13 has a higher impurity concentration than the $n^-$ type epitaxial layer 5. The n type drain region 13 is formed to an endless shape such as to surround the p type well region 15 in plan view. In this preferred embodiment, the n type drain region 13 is formed to a quadrilateral annular shape along the field insulating film 11 in plan view. An $n^+$ type drain contact region 14 having a higher impurity concentration than the n type drain region 13 is formed in a surface layer portion of the n type drain region 13.

An n type source region 16 having a higher impurity concentration than the $n^-$ type epitaxial layer 5 is formed in a surface layer portion of the p type well region 15. An $n^+$ type source contact region 17 having a higher impurity concentration than the n type source region 16 is formed in a surface layer portion of the n type source region 16.

The n type source region 16 is formed, for example, with the same concentration and at the same depth as the n type drain region 13. An outer peripheral edge of the $n^+$ type source contact region 17 is disposed at an interval inward from an outer peripheral edge of the p type well region 15. The $n^+$ type source contact region 17 is formed, for example, with the same concentration and at the same depth as the $n^+$ type drain contact region 14.

In the $n^-$ type epitaxial layer 5, a p type embedded layer 10 for making uniform an potential distribution between the $n^+$ type source contact region 17 and the $n^+$ type drain contact region 14 (hereinafter referred to as the "source-drain potential distribution") is formed below the p type well region 15. In this preferred embodiment, the p type embedded layer 10 is disposed below the p type well region 15 and at the same time above the $n^+$ type embedded layer 6. In this preferred embodiment, the p type embedded layer 10 is disposed separately from the p type well region 15 below the p type well region 15.

In this preferred embodiment, the p type embedded layer 10 is of quadrilateral shape that is long in the longitudinal direction in plan view. A width of the p type embedded layer 10 is greater than a width of the p type well region 15 and in plan view, both sides of the p type embedded layer project outward from both sides of the p type well region 15. Also, in this preferred embodiment, the p type embedded layer 10 is disposed inside a region that is surrounded by the $n^+$ type drain contact region 14 in plan view.

A film thickness of the p type embedded layer 10 is, for example, approximately 2.0 μm to 5.0 μm. A p type impurity concentration of the p type embedded layer 10 is preferably not less than $1.0\times10^{16}$ $cm^{-3}$ and not more than $1.0\times10^{18}$ $cm^{-3}$. In this preferred embodiment, the p type impurity concentration of the p type embedded layer 10 is approximately $1.0\times10^{17}$ $cm^{-3}$.

On the front surface of the $n^-$ type epitaxial layer 5, a field insulating film 12 of quadrilateral annular shape in plan view is formed in a portion between the $n^+$ type drain contact region 14 and the p type well region 15. The field insulating film 12 is a LOCOS film that is formed in the same step as the field insulating film 11 described above. In FIG. 1, an inner peripheral edge of the field insulating film 12 is indicated by a reference sign 12*a*.

The inner peripheral edge 12*a* of the field insulating film 12 is disposed at an interval outward from the outer peripheral edge of the p type well region 15 and an outer peripheral edge of the field insulating film 12 is disposed on an inner peripheral edge of the $n^+$ type drain contact region 14. The $n^+$ type drain contact region 14 is formed in a region sandwiched by the outer peripheral edge of the field insulating film 12 and an inner peripheral edge of the field insulating film 11.

Also, on the front surface of the $n^-$ type epitaxial layer 5, a gate insulating film 18 is formed such as to extend across the $n^-$ type epitaxial layer 5 and the p type well region 15. The gate insulating film 18 is formed to a quadrilateral annular shape such as to surround the $n^+$ type source contact region 17 in plan view. Also, a gate electrode 19 is formed on the gate insulating film 18. The gate electrode 19 is formed to a quadrilateral annular shape such as to surround the n type source region 16 in plan view. The gate electrode 19 is formed such as to selectively cover a portion of the gate insulating film 18 and a portion of the field insulating film 12.

The gate electrode 19 is constituted, for example, of polysilicon. The gate insulating film 18 is, for example, a silicon oxide film that is formed by oxidizing the front surface of the $n^-$ type epitaxial layer 5.

A region in which the gate electrode 19 opposes the p type well region 15 via the gate insulating film 18 is a channel region 20 of the DMOS transistor 40. Forming of a channel in the channel region 20 is controlled by the gate electrode 19.

The interlayer insulating film 21 is formed such as to cover the entire element region 2. The interlayer insulating film 21 is formed, for example, of an insulating film such as an oxide film, a nitride film, etc.

Drain contact plugs 22, source contact plugs 23, and gate contact plugs 24 are embedded in the interlayer insulating film 21. Lower ends of the drain contact plugs 22 are electrically connected to the $n^+$ type drain contact region 14. Lower ends of the source contact plugs 23 are electrically connected to the $n^+$ type source contact region 17. The gate contact plugs are electrically connected to the gate electrode 19.

The drain wiring 25, the source wiring 26, and a gate wiring (not shown) are formed on the interlayer insulating film 21. The drain wiring 25 is electrically connected to the $n^+$ type drain contact region 14 via the plurality of drain contact plugs 22. The source wiring 26 is electrically connected to the $n^+$ type source contact region 17 via the plurality of source contact plugs 23. The gate wiring is electrically connected to the gate electrode 19 via the plurality of gate contact plugs 24.

Although not illustrated in FIG. 1, the source wiring 26 has a quadrilateral shape that is long in the longitudinal direction and covers a length intermediate portion between both end portions of the gate electrode 19 in plan view. A plurality of locations of a width central portion of the source wiring 26 are electrically connected to the $n^+$ type source contact region 17 via the plurality of source contact plugs 23. The gate wiring is electrically connected to both end portions of the gate electrode 19 via the plurality of gate contact plugs 24.

The drain wiring 25 is formed to a quadrilateral annular shape such as to surround the field insulating film 12 in plan view. The drain wiring 25 is disposed such as to cover the $n^+$ type drain contact region 14.

With this preferred embodiment, the source-drain potential distribution can be made uniform because in the $n^-$ type epitaxial layer 5, the p type embedded layer 10 is formed below the p type well region 15. A withstand voltage of the DMOS transistor 40 can thereby be improved.

The semiconductor device 1 of FIG. 1 and FIG. 2 shall be referred to as "the present preferred embodiment" and an arrangement with which the p type embedded layer 10 is not formed in the semiconductor device 1 of FIG. 1 and FIG. 2 shall be referred to as a "comparative example."

A drain current Id and a source-drain potential distribution when a drain voltage Vd is gradually increased with a gate potential, a source potential, and a substrate potential being 0 V were calculated by simulation for each of the comparative example and the present preferred embodiment.

Figure 3:
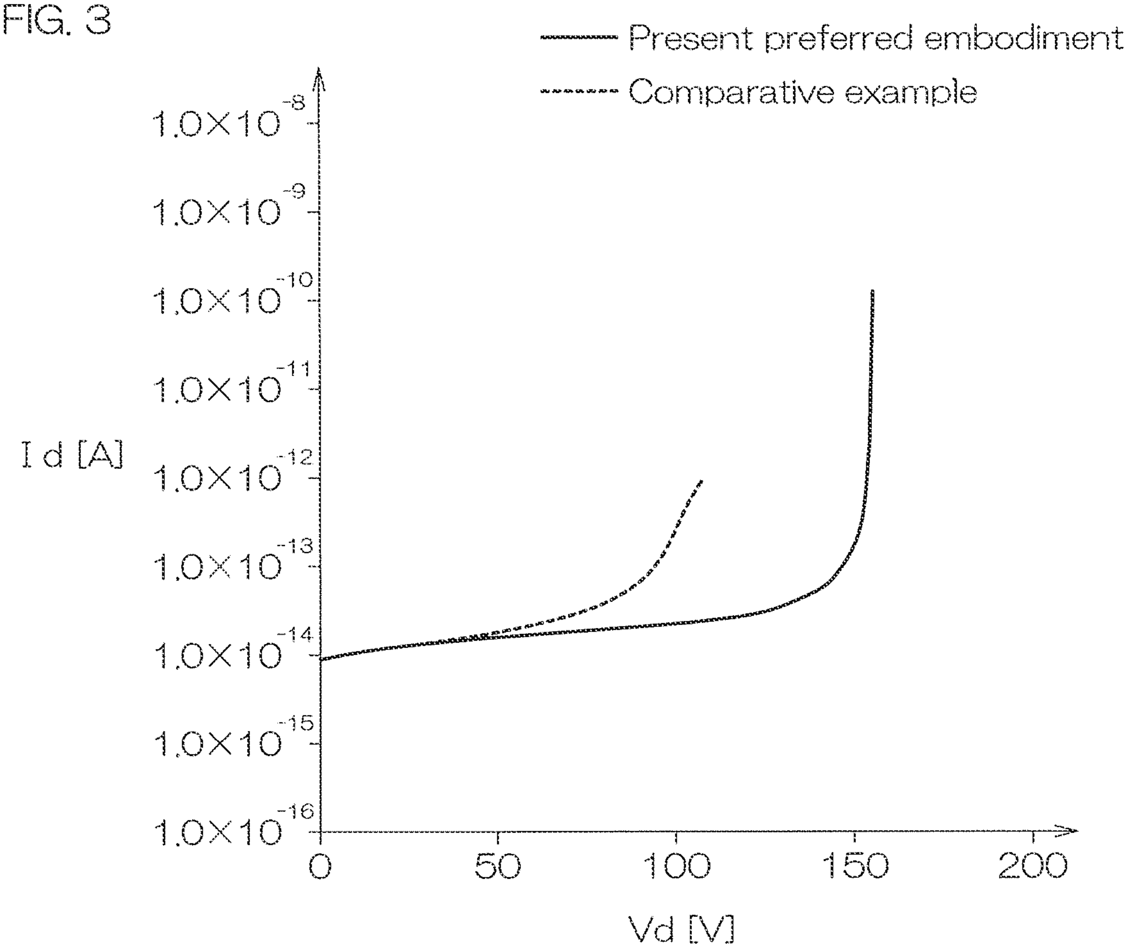
FIG. 3 is a graph of Vd-Id characteristic calculation results for each of a comparative example and the present preferred embodiment.

FIG. 3 is a graph of Vd-Id characteristic calculation results for each of the comparative example and the present preferred embodiment. In FIG. 3, a broken line indicates the Vd-Id characteristic calculation results for the comparative example and a solid line indicates the Vd-Id characteristic calculation results for the present preferred embodiment.

From FIG. 3, it can be understood that whereas a breakdown voltage is approximately 100 V with the comparative example, it is approximately 150 V with the present preferred embodiment and that the present preferred embodiment is improved in withstand voltage in comparison to the comparative example.

Figure 4:
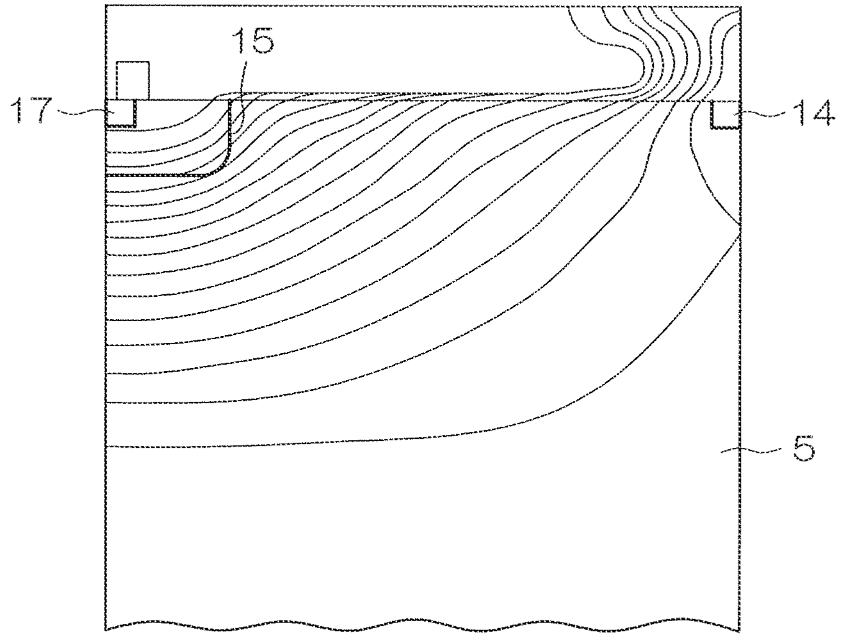
FIG. 4 is an equipotential line diagram of a source-drain potential distribution of the comparative example when a drain voltage Vd is 100 V.
Figure 5:
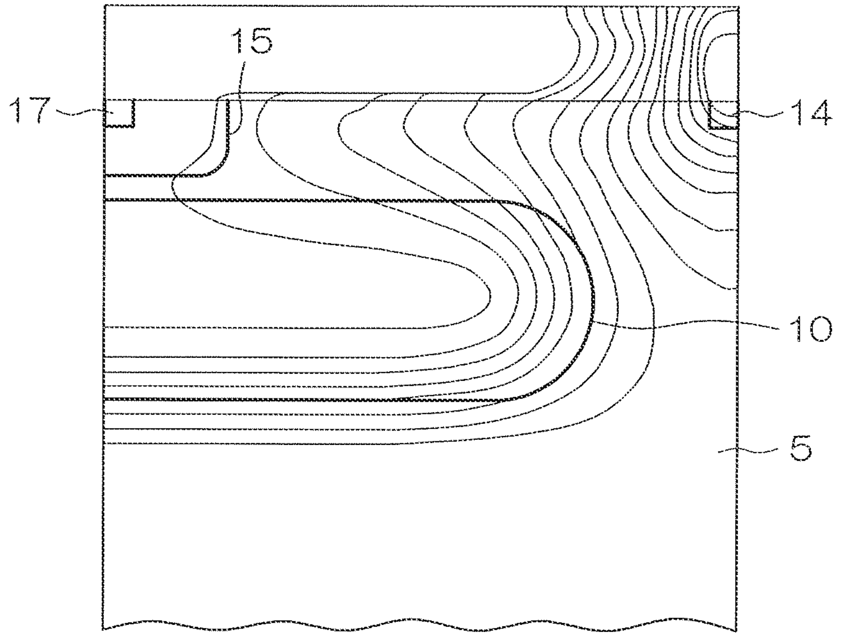
FIG. 5 is an equipotential line diagram of a source-drain potential distribution of the present preferred embodiment when the drain voltage Vd is 150 V.

FIG. 4 is an equipotential line diagram of the source-drain potential distribution of the comparative example when the drain voltage Vd is 100 V. FIG. 5 is an equipotential line diagram of the source-drain potential distribution of the present preferred embodiment when the drain voltage Vd is 150 V.

As shown in FIG. 4, with the comparative example, equipotential lines extend in oblique directions with respect to the front surface of the $n^-$ type epitaxial layer 5 and the source-drain potential distribution is nonuniform in the surface layer portion of the $n^-$ type epitaxial layer 5. More specifically, within a region between the $n^+$ type source contact region 17 and the $n^+$ type drain contact region 14, intervals between the equipotential lines are narrower in an $n^+$ type source contact region 17 side region. A high concentration of electric field thus occurs in the $n^+$ type source contact region 17 side region.

On the other hand, with the present preferred embodiment, the p type embedded layer 10 is formed and therefore, the equipotential lines take on shapes such as to be spread out from the $n^+$ type source contact region 17 toward the $n^+$ type drain contact region 14 as shown in FIG. 5. The equipotential lines thereby extend in substantially perpendicular directions with respect to the front surface of the $n^-$ type epitaxial layer 5 in the surface layer portion of the $n^-$ type epitaxial layer 5. The source-drain potential distribution is thereby made more uniform in the surface layer portion of the $n^-$ type epitaxial layer 5. It is considered that the breakdown voltage is thereby made significantly higher in the present preferred embodiment in comparison to the comparative example.

Next, a manufacturing process of the semiconductor device 1 shall be described with reference to FIG. 6A to FIG. 6I. FIG. 6A to FIG. 6I are sectional views for describing an example of the manufacturing process of the semiconductor device 1 and are sectional views corresponding to the section plane of FIG. 2.

Figure 6A:
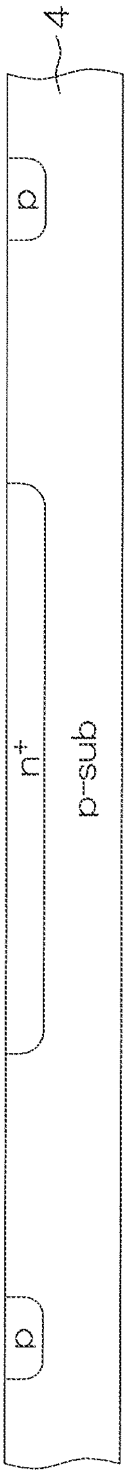
FIG. 6A is a sectional view of an example of a manufacturing process of the semiconductor device shown in FIG. 1 and FIG. 2 and is a sectional view corresponding to the section plane of FIG. 2.
Figure 6B:
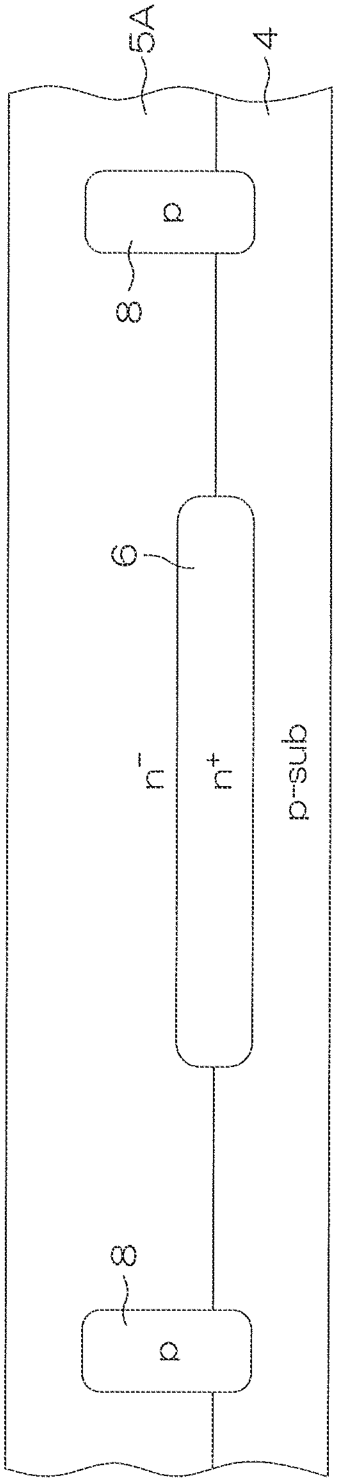
FIG. 6B is a sectional view of a step subsequent to that of FIG. 6A.

To manufacture the semiconductor device 1, the p type semiconductor substrate 4 is prepared as shown in FIG. 6A. Next, an n type impurity for forming the $n^+$ type embedded layer 6 and a p type impurity for forming the lower isolation region 8 are selectively implanted into a front surface of the p type semiconductor substrate 4. Silicon is then epitaxially grown on the p type semiconductor substrate 4 while adding the n type impurity under a heated state, for example, of not less than 1100° C. A lower layer portion (hereinafter referred to as the "epitaxial lower layer portion 5A") of the $n^-$ type epitaxial layer 5 is thereby formed on the p type semiconductor substrate 4 as shown in FIG. 6B. The epitaxial lower layer portion 5A is an example of a "first n type epitaxial layer" of the present invention.

In the process of epitaxial growth, the n type impurity and the p type impurity implanted in the p type semiconductor substrate 4 diffuse in a growth direction of the epitaxial lower layer portion 5A. The $n^+$ type embedded layer 6 and the lower isolation region 8 of the p type that extend across a boundary between the p type semiconductor substrate 4 and the epitaxial lower layer portion 5A are thereby formed. Here, as the p type impurity, for example, B (boron), Al (aluminum), etc., can be cited and as the n type impurity, for example, P (phosphorus), As (arsenic), etc., can be cited.

Figure 6C:
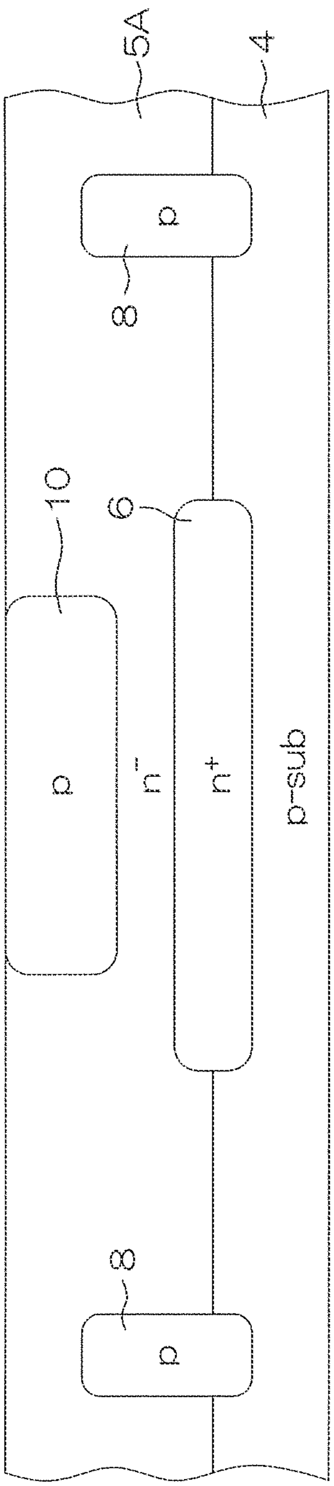
FIG. 6C is a sectional view of a step subsequent to that of FIG. 6B.

Next, as shown in FIG. 6C, a p type impurity for forming the p type embedded layer 10 is selectively implanted into a front surface of the epitaxial lower layer portion 5A. Here, as the p type impurity, for example, B (boron), Al (aluminum), etc., can be cited. The p type embedded layer 10 is thereby formed in the epitaxial lower layer portion 5A.

Figure 6D:
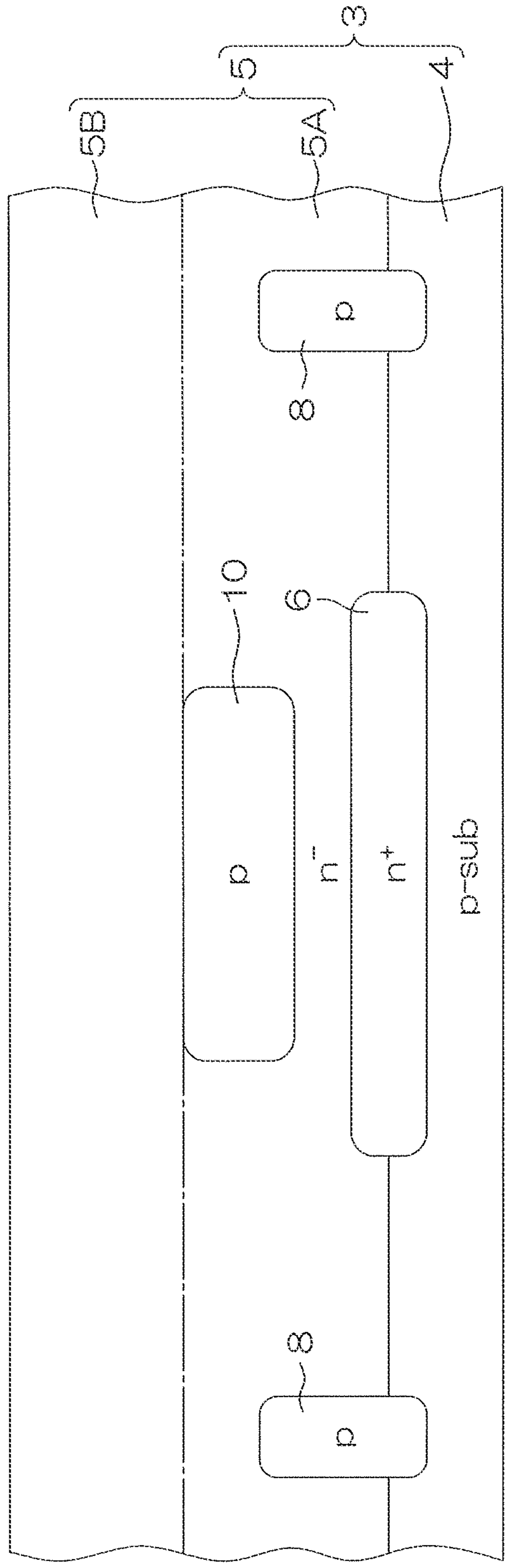
FIG. 6D is a sectional view of a step subsequent to that of FIG. 6C.

The silicon of the epitaxial lower layer portion 5A is then epitaxially grown while adding the n type impurity under a heated state, for example, of not less than 1100° C. An upper layer portion (hereinafter referred to as the "epitaxial upper layer portion 5B") of the $n^-$ type epitaxial layer 5 is thereby formed on the epitaxial lower layer portion 5A as shown in FIG. 6D. The $n^-$ type epitaxial layer 5 that is constituted of the epitaxial lower layer portion 5A and the epitaxial upper layer portion 5B is thereby formed. The base body 3 that includes the p type semiconductor substrate 4 and the $n^-$ type epitaxial layer 5 is thereby formed. The epitaxial upper layer portion 5B is an example of a "second n type epitaxial layer" of the present invention.

Figure 6E:
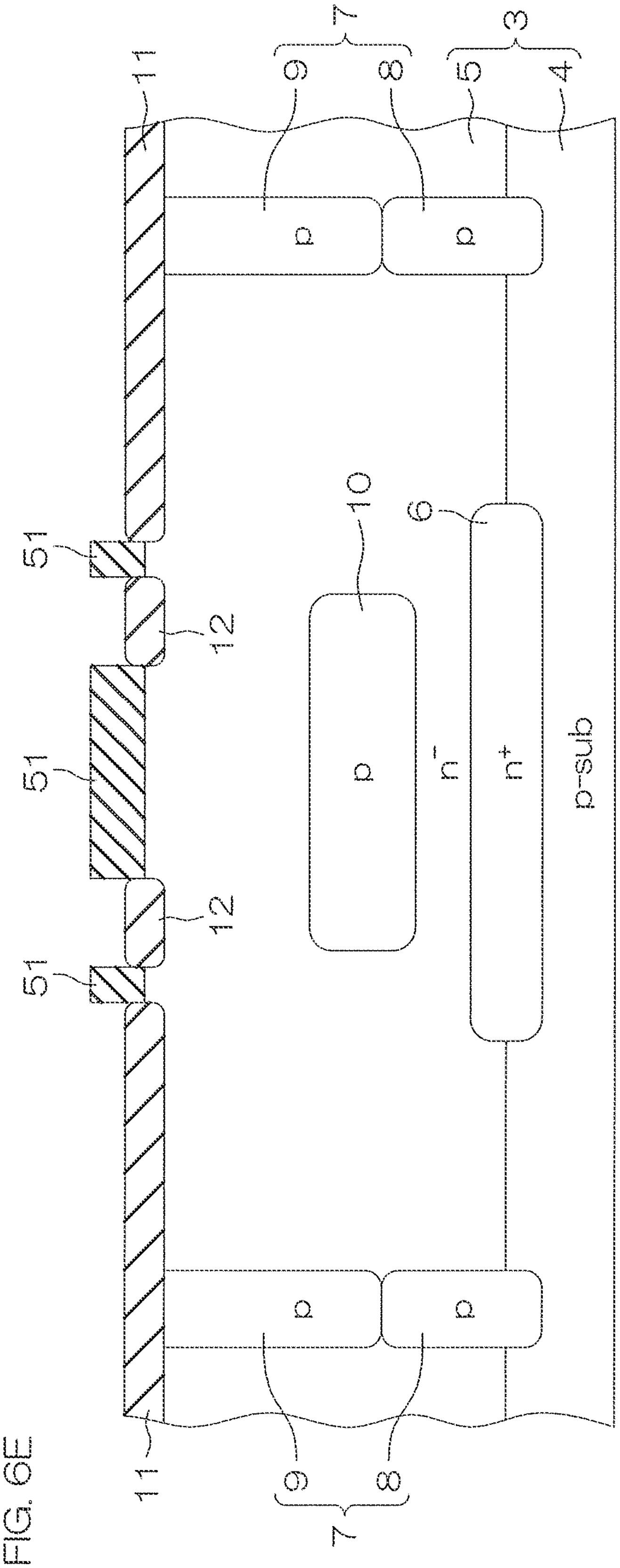
FIG. 6E is a sectional view of a step subsequent to that of FIG. 6D.

Next, an ion implantation mask (not shown) having an opening selectively in a region in which the upper isolation region 9 of the p type is to be formed as shown in FIG. 6E is formed on the $n^-$ type epitaxial layer 5. The p type impurity is then implanted into the $n^-$ type epitaxial layer 5 via the ion implantation mask. The p type element isolation region 7 that is constituted of a two-layer structure of the lower isolation region 8 and the upper isolation region 9 is thereby formed. The ion implantation mask is thereafter removed.

Next, a hard mask 51 having openings selectively in regions in which the field insulating films 11 and 12 are to be formed is formed on the $n^-$ type epitaxial layer 5. A thermal oxidation treatment is then applied to the front surface of the $n^-$ type epitaxial layer 5 via the hard mask 51 to form the field insulating films 11 and 12. The hard mask 51 is thereafter removed.

Figure 6F:
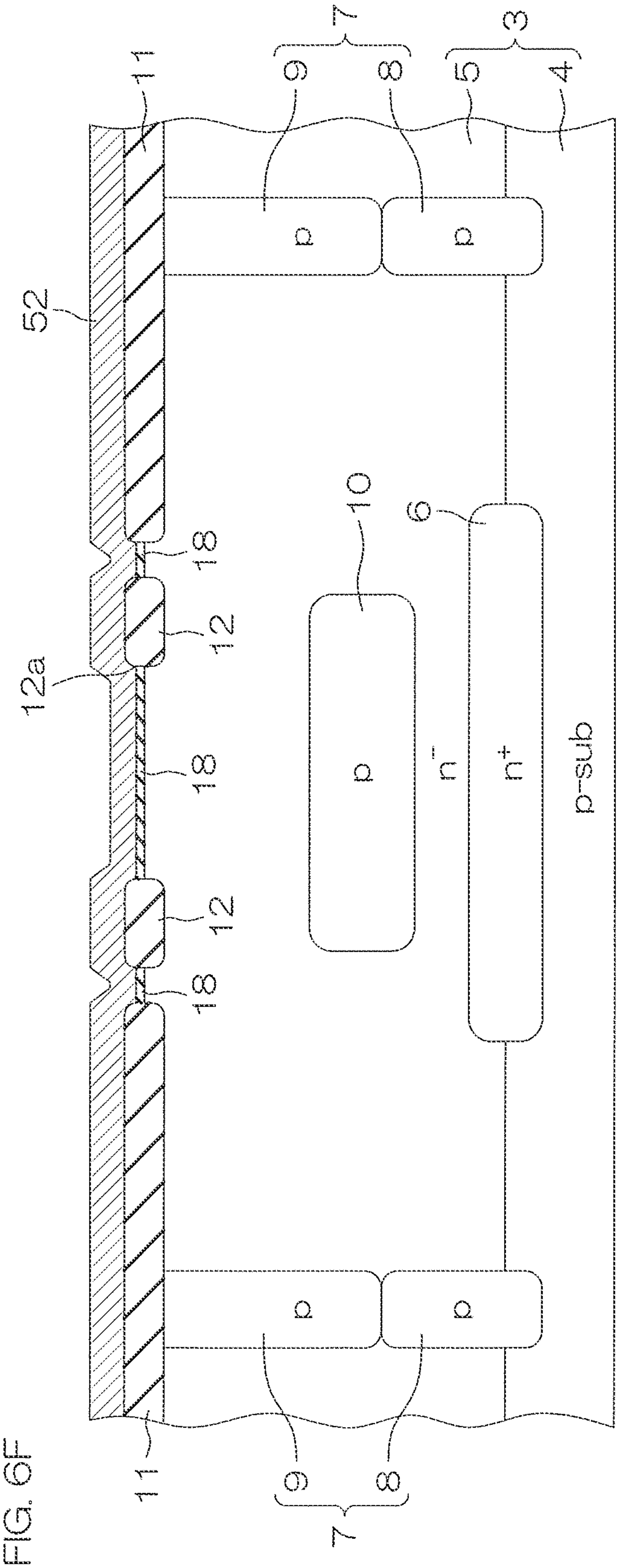
FIG. 6F is a sectional view of a step subsequent to that of FIG. 6E.

Next, as shown in FIG. 6F, a thermal oxidation treatment is applied to the front surface of the $n^-$ type epitaxial layer 5 to form the gate insulating film 18. In this process, the gate insulating film 18 is formed such as to be continuous with the field insulating films 11 and 12. Next, the polysilicon for the gate electrode 19 is deposited on the $n^-$ type epitaxial layer 5 to form a polysilicon layer 52.

Figure 6G:
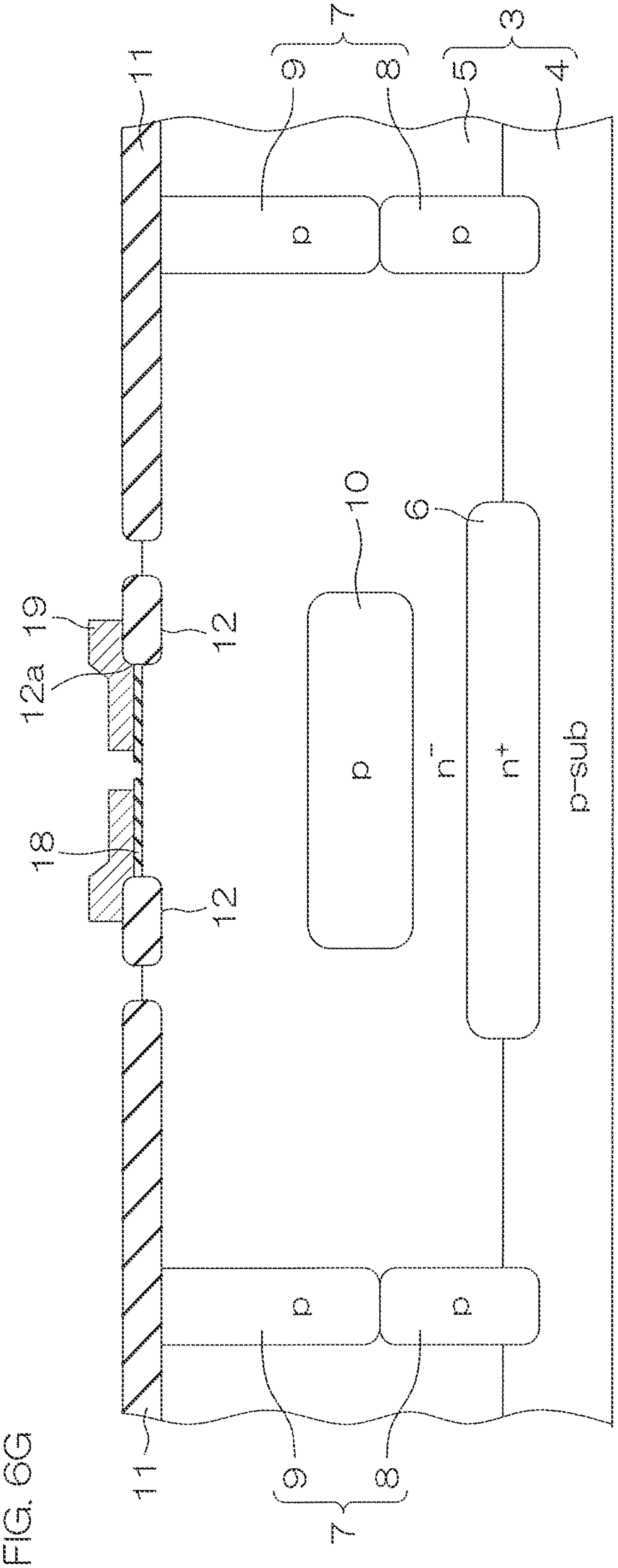
FIG. 6G is a sectional view of a step subsequent to that of FIG. 6F.

Next, a resist mask (not shown) having an opening selectively in a region in which the gate electrode 19 is to be formed as shown in FIG. 6G is formed on the polysilicon layer 52. Unnecessary portions of the polysilicon layer 52 are then removed by etching via the resist mask. The gate electrode 19 is thereby formed. The resist mask is thereafter removed.

Next, in order to remove unnecessary portions of the gate insulating film 18, a hard mask (not shown) having openings selectively is formed on the $n^-$ type epitaxial layer 5. An etching treatment is then applied to the unnecessary portions of the gate insulating film 18 via the hard mask. The predetermined gate insulating film 18 is thereby formed. The hard mask is thereafter removed. Here, this step of selectively etching the gate insulating film 18 may be omitted.

Figure 6H:
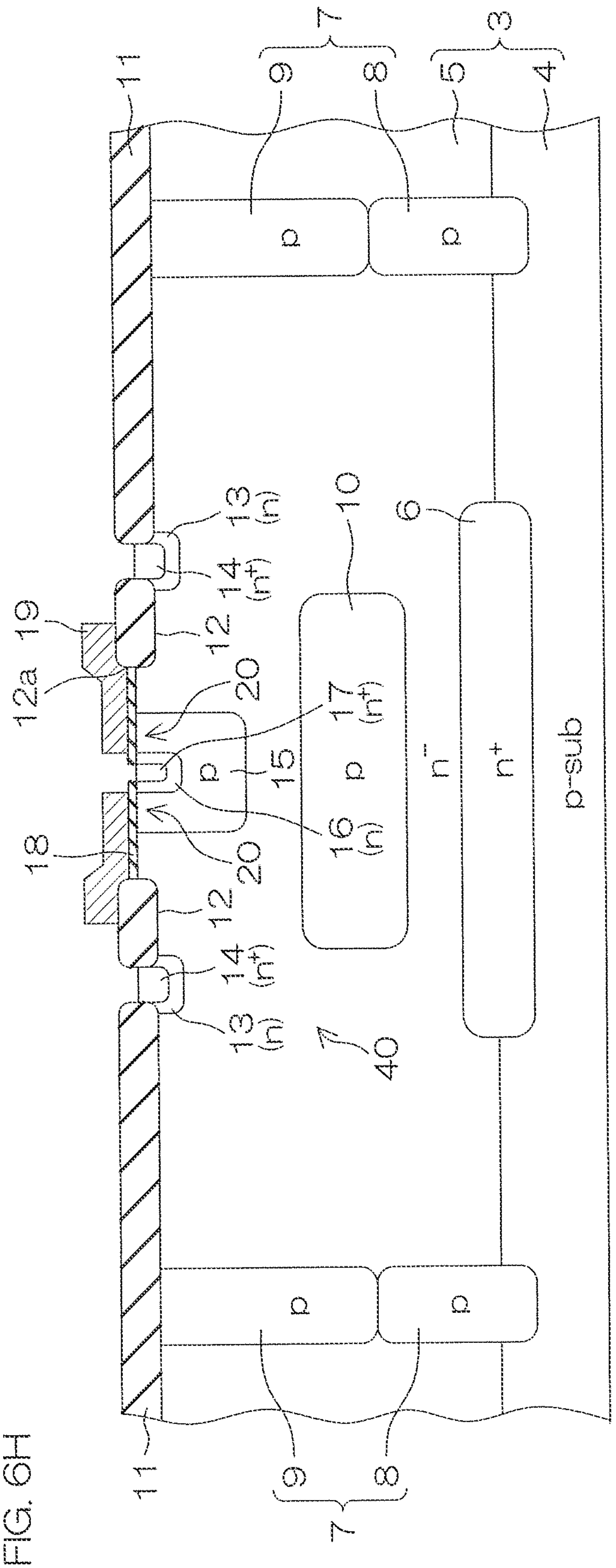
FIG. 6H is a sectional view of a step subsequent to that of FIG. 6G.

Next, as shown in FIG. 6H, the p type well region 15 is formed in the surface layer portion of the $n^-$ type epitaxial layer 5. To form the p type well region 15, first, an ion implantation mask (not shown) having an opening selectively in a region in which the p type well region 15 is to be formed is formed. The p type impurity is then implanted into the $n^-$ type epitaxial layer 5 via the ion implantation mask. Thereafter, the p type impurity is thermally diffused at a temperature, for example, of 900° C. to 1100° C. The p type well region 15 is thereby formed. The ion implantation mask is thereafter removed. It is possible to suppress the p type well region 15 from spreading to the epitaxial upper layer portion 5B by making the temperature of the thermal diffusion comparatively low or by making a time of the thermal diffusion comparatively short.

Here, the p type well region 15 may instead be formed by selectively implanting the p type impurity into the $n^-$ type epitaxial layer 5 at a stage before the gate insulating film 18 and the gate electrode 19 are formed (FIG. 6E).

Next, the n type drain region 13 is formed in the surface layer portion of the $n^-$ type epitaxial layer 5 and, at the same time, the n type source region 16 is formed in an inner region (surface layer portion) of the p type well region 15. To form the n type drain region 13 and the n type source region 16, first, an ion implantation mask (not shown) having openings selectively and respectively in a region in which the n type drain region 13 is to be formed and a region in which the n type source region 16 is to be formed is formed. The n type impurity is then implanted into the $n^-$ type epitaxial layer 5 via the ion implantation mask. The n type drain region 13 and the n type source region 16 are thereby formed. The ion implantation mask is thereafter removed.

Next, the $n^+$ type drain contact region 14 and the $n^+$ type source contact region 17 are selectively formed respectively in respective inner regions (surface layer portions) of the n type drain region 13 and the n type source region 16. To form the $n^+$ type drain contact region 14 and the $n^+$ type source contact region 17, first, an ion implantation mask (not shown) having openings selectively and respectively in regions in which the $n^+$ type drain contact region 14 and the $n^+$ type source contact region 17 are to be formed is formed. The n type impurity is then implanted into the n type drain region 13 and the n type source region 16 via the ion implantation mask. The $n^+$ type drain contact region 14 and the $n^+$ type source contact region 17 are thereby formed. The ion implantation mask is thereafter removed.

Figure 6I:
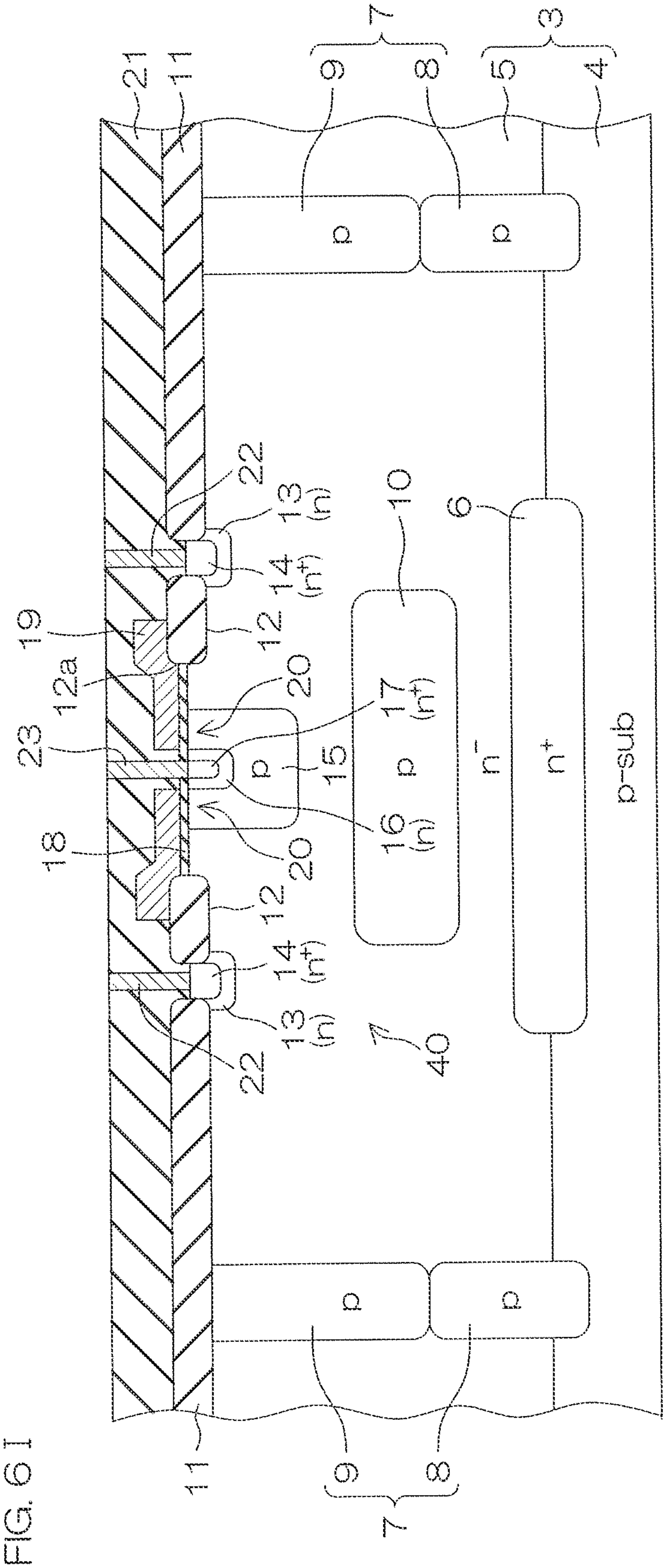
FIG. 6I is a sectional view of a step subsequent to that of FIG. 6H.

Next, as shown in FIG. 6I, an insulating material is deposited such as to cover the gate electrode 19 and the interlayer insulating film 21 is thereby formed. Next, the drain contact plugs 22, the source contact plugs 23, and the gate contact plugs 24 are formed such as to penetrate through the interlayer insulating film 21. The drain contact plugs 22, the source contact plugs 23, and the gate contact plugs 24 are electrically connected respectively to the $n^+$ type drain contact region 14, the $n^+$ type source contact region 17, and the gate electrode 19.

Lastly, the drain wiring 25, the source wiring 26, and the gate wiring (not shown) that are electrically connected respectively to the drain contact plugs 22, the source contact plugs 23, and the gate contact plugs 24 are selectively formed on the interlayer insulating film 21. To form the drain wiring 25, the source wiring 26, and the gate wiring, for example, a wiring material layer is formed on the interlayer insulating film 21. The drain wiring 25, the source wiring 26, and the gate wiring are then formed by selectively removing the wiring material layer by photolithography and etching. The semiconductor device 1 according to the first preferred embodiment is manufactured through the above steps.

Figure 7:
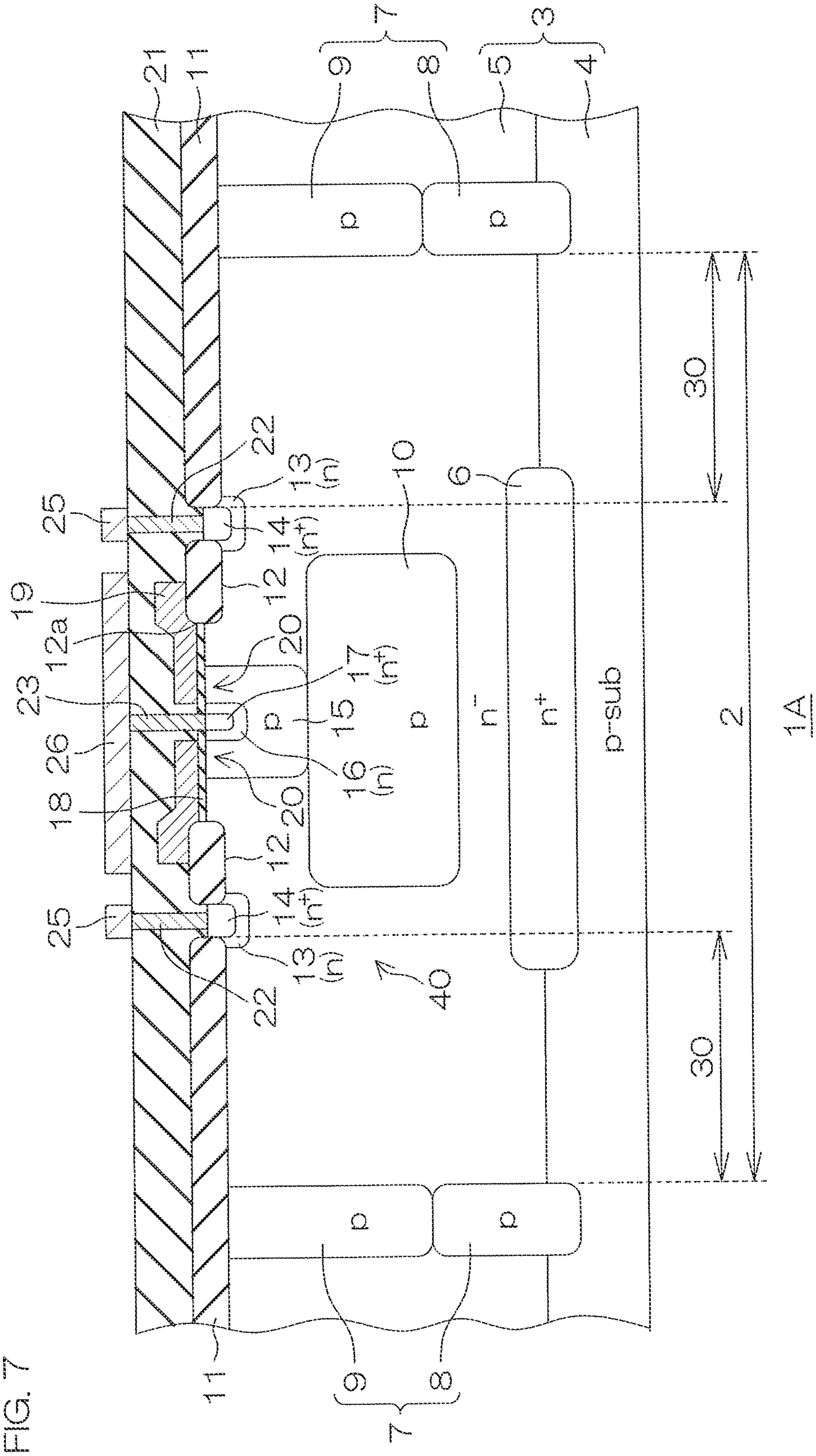
FIG. 7 is an illustrative sectional view for describing the arrangement of a semiconductor device according to a second preferred embodiment of the present invention.

Next, a semiconductor device 1A according to a second preferred embodiment of the present invention shall be described with reference to FIG. 7. FIG. 7 is an illustrative sectional view for describing the arrangement of the semiconductor device according to the second preferred embodiment of the present invention and is a sectional view corresponding to the section plane of FIG. 2. In FIG. 7, respective portions corresponding to respective portions in FIG. 2 described above are indicated with the same reference signs attached as in FIG. 2.

A plan view of the semiconductor device 1A according to the second preferred embodiment is the same as the plan view (FIG. 1) of the semiconductor device 1 according to the first preferred embodiment.

The semiconductor device 1A according to the second preferred embodiment differs from the semiconductor device 1 according the first preferred embodiment described above in that below the p type well region 15, the p type embedded layer 10 is connected to the p type well region 15.

More specifically, the p type embedded layer 10 in the second preferred embodiment is formed to be greater in thickness than the p type embedded layer 10 in the first preferred embodiment. Also, a lower portion of the p type well region 15 in the second preferred embodiment is connected to an upper portion of the p type embedded layer 10.

A method for manufacturing the semiconductor device 1A according to the second preferred embodiment is substantially the same as the method for manufacturing the semiconductor device 1 according to the first preferred embodiment that was described using FIG. 6A to FIG. 6I. However, steps from FIG. 6E onward after the p type impurity for forming the p type embedded layer 10 is selectively implanted into the front surface of the epitaxial lower layer portion 5A in FIG. 6C described above differ slightly.

For example, the p type impurity implanted into the epitaxial lower layer portion 5A diffuses in a growth direction of the epitaxial upper layer portion 5B by the temperature and the time of the thermal diffusion performed in the steps of FIG. 6E to FIG. 6G being increased or by a thermal diffusing being added anew. The p type embedded layer 10 is thereby formed such as to extend across a boundary between the epitaxial lower layer portion 5A and the epitaxial upper layer portion 5B is thereby formed.

When in the step of FIG. 6H, the p type well region 15 is formed in the surface layer portion of the n-type epitaxial layer 5, the lower portion of the p type well region 15 becomes connected to the upper portion of the p type embedded layer 10.

Also, the semiconductor device 1A according to the second preferred embodiment can instead be manufactured by another manufacturing method such as shown in FIG. 8A to FIG. 8H. FIG. 8A to FIG. 8H are sectional views corresponding to the section plane of FIG. 2.

Figure 8A:
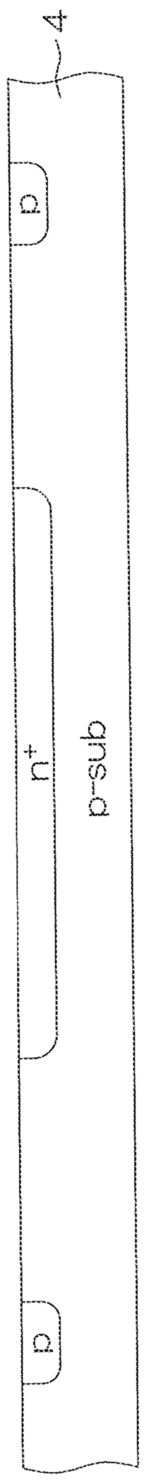
FIG. 8A is a sectional view of an example of a manufacturing process of the semiconductor device shown in FIG. 7 and is a sectional view corresponding to the section plane of FIG. 7.

First, the p type semiconductor substrate 4 is prepared as shown in FIG. 8A mentioned above. Next, the n type impurity for forming the $n^+$ type embedded layer 6 and the p type impurity for forming the lower isolation region 8 are selectively implanted into the front surface of the p type semiconductor substrate 4.

Figure 8B:
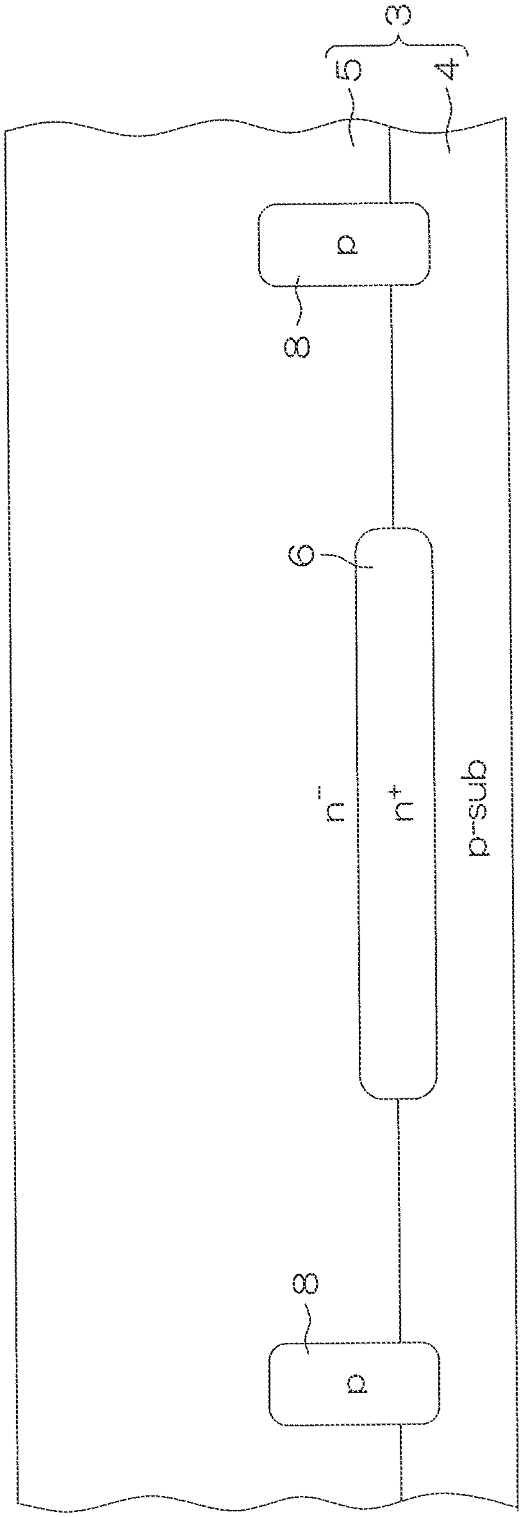
FIG. 8B is a sectional view of a step subsequent to that of FIG. 8A.

Silicon is then epitaxially grown on the p type semiconductor substrate 4 while adding the n type impurity under a heated state, for example, of not less than 1100° C. The base body 3 that includes the p type semiconductor substrate 4 and the $n^-$ type epitaxial layer 5 is thereby formed as shown in FIG. 8B.

In the process of epitaxial growth of the p type semiconductor substrate 4, the n type impurity and the p type impurity implanted in the p type semiconductor substrate 4 diffuse in the growth direction of the $n^-$ type epitaxial layer 5. The $n^+$ type embedded layer 6 and the lower isolation region 8 of the p type that extend across the boundary between the p type semiconductor substrate 4 and the $n^-$ type epitaxial layer 5 are thereby formed. Here, as the p type impurity, for example, B (boron), Al (aluminum), etc., can be cited and as the n type impurity, for example, P (phosphorus), As (arsenic), etc., can be cited.

Figure 8C:
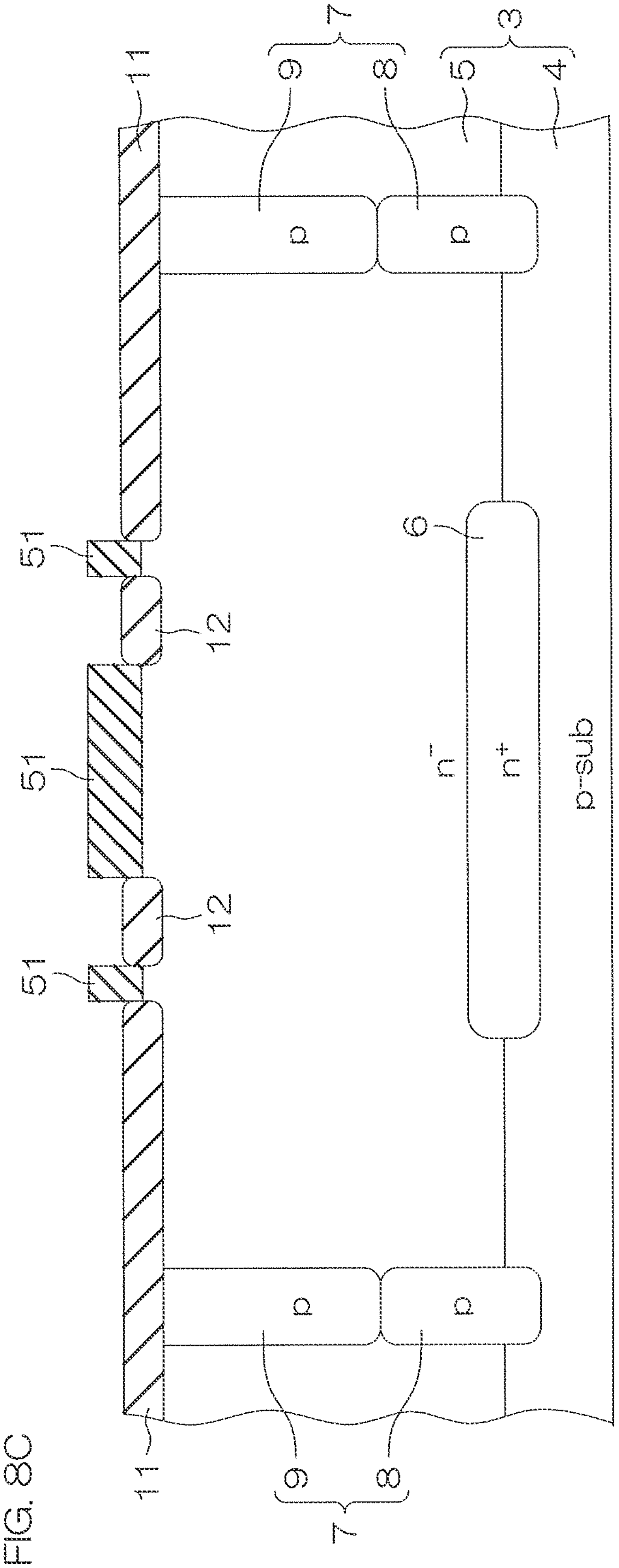
FIG. 8C is a sectional view of a step subsequent to that of FIG. 8B.

Next, an ion implantation mask (not shown) having an opening selectively in a region in which the upper isolation region 9 of the p type is to be formed as shown in FIG. 8C is formed on the $n^-$ type epitaxial layer 5. The p type impurity is then implanted into the $n^-$ type epitaxial layer 5 via the ion implantation mask. The p type element isolation region 7 that is constituted of the two-layer structure of the lower isolation region 8 and the upper isolation region 9 is thereby formed. The ion implantation mask is thereafter removed.

Next, the hard mask 51 having openings selectively in regions in which the field insulating films 11 and 12 are to be formed is formed on the $n^-$ type epitaxial layer 5. A thermal oxidation treatment is then applied to the front surface of the $n^-$ type epitaxial layer 5 via the hard mask 51 to form the field insulating films 11 and 12. The hard mask 51 is thereafter removed.

Figure 8D:
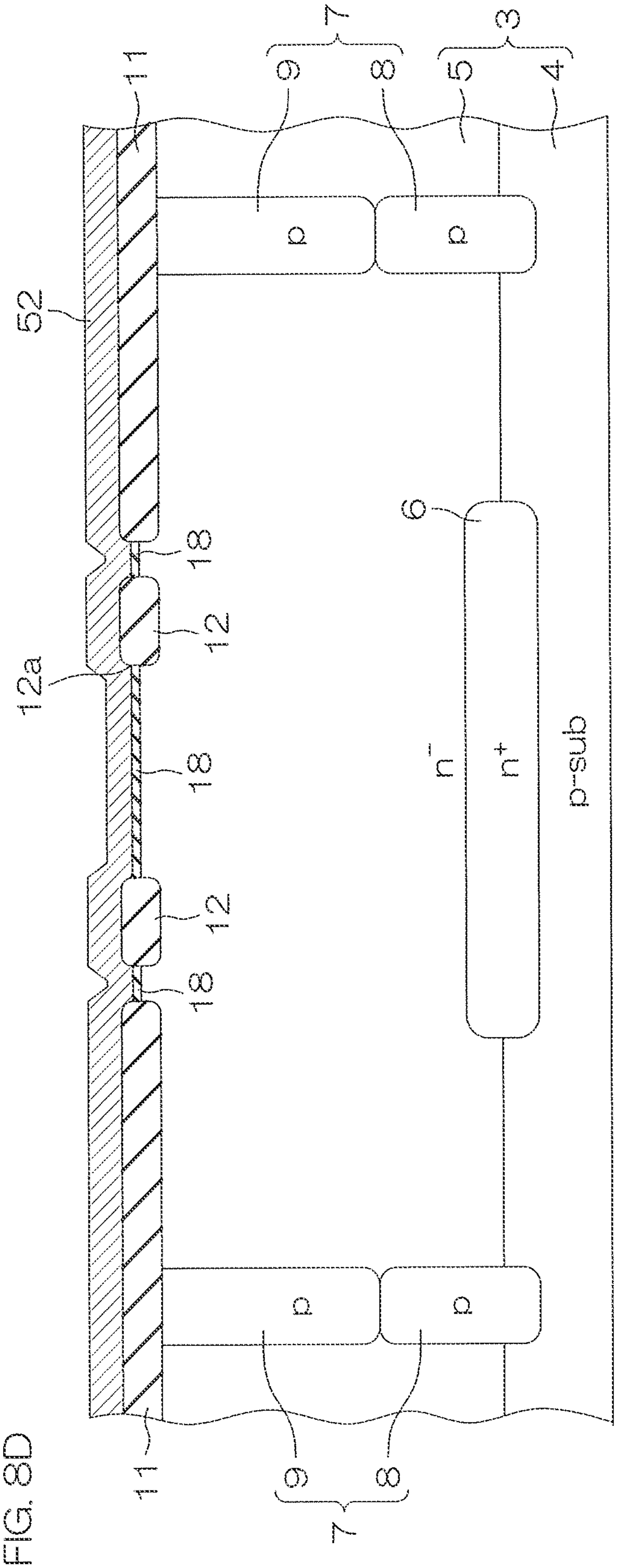
FIG. 8D is a sectional view of a step subsequent to that of FIG. 8C.

Next, as shown in FIG. 8D, a thermal oxidation treatment is applied to the front surface of the $n^-$ type epitaxial layer 5 to form the gate insulating film 18. In this process, the gate insulating film 18 is formed such as to be continuous with the field insulating films 11 and 12. Next, the polysilicon for the gate electrode 19 is deposited on the $n^-$ type epitaxial layer 5 to form the polysilicon layer 52.

Figure 8E:
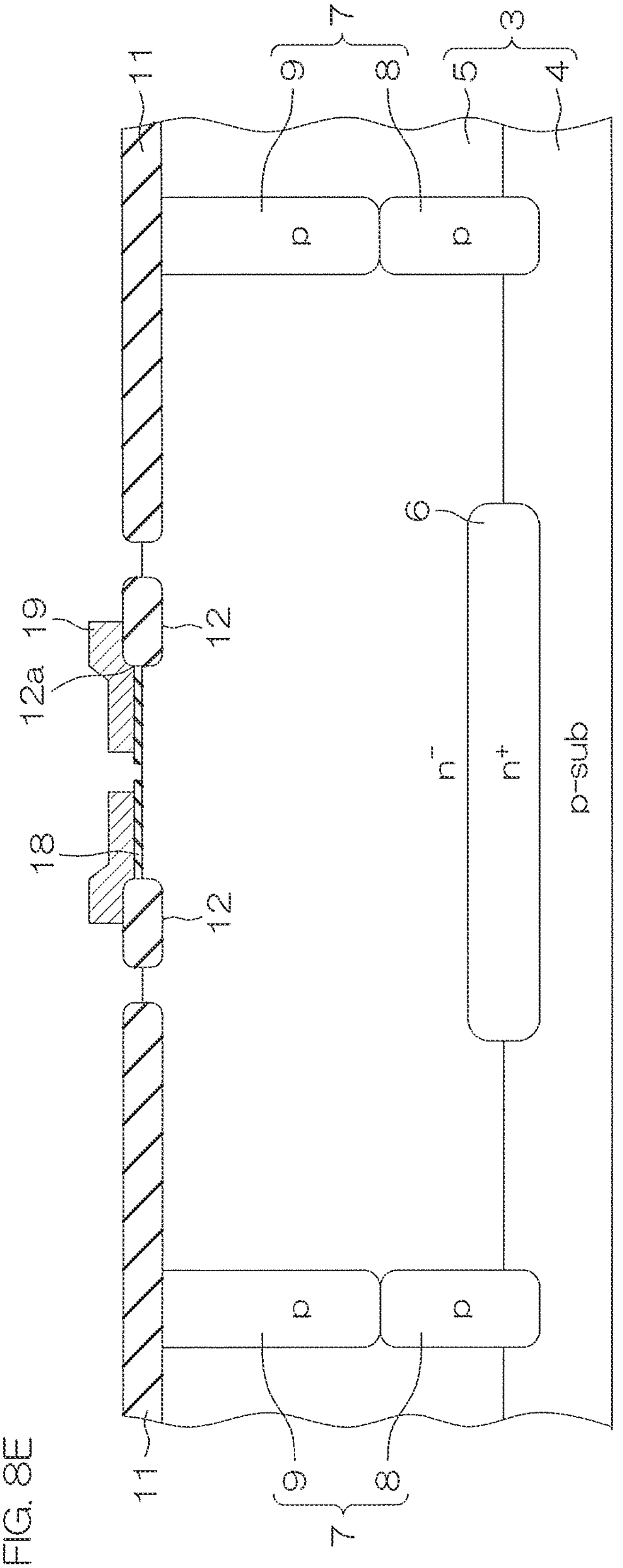
FIG. 8E is a sectional view of a step subsequent to that of FIG. 8D.

Next, a resist mask (not shown) having an opening selectively in a region in which the gate electrode 19 is to be formed as shown in FIG. 8E is formed on the polysilicon layer 52. Unnecessary portions of the polysilicon layer 52 are then removed by etching via the resist mask. The gate electrode 19 is thereby formed. The resist mask is thereafter removed.

Next, in order to remove unnecessary portions of the gate insulating film 18, a hard mask (not shown) having openings selectively is formed on the $n^-$ type epitaxial layer 5. An etching treatment is then applied to the unnecessary portions of the gate insulating film 18 via the hard mask. The predetermined gate insulating film 18 is thereby formed. The hard mask is thereafter removed. Here, this step of selectively etching the gate insulating film 18 may be omitted.

Figure 8F:
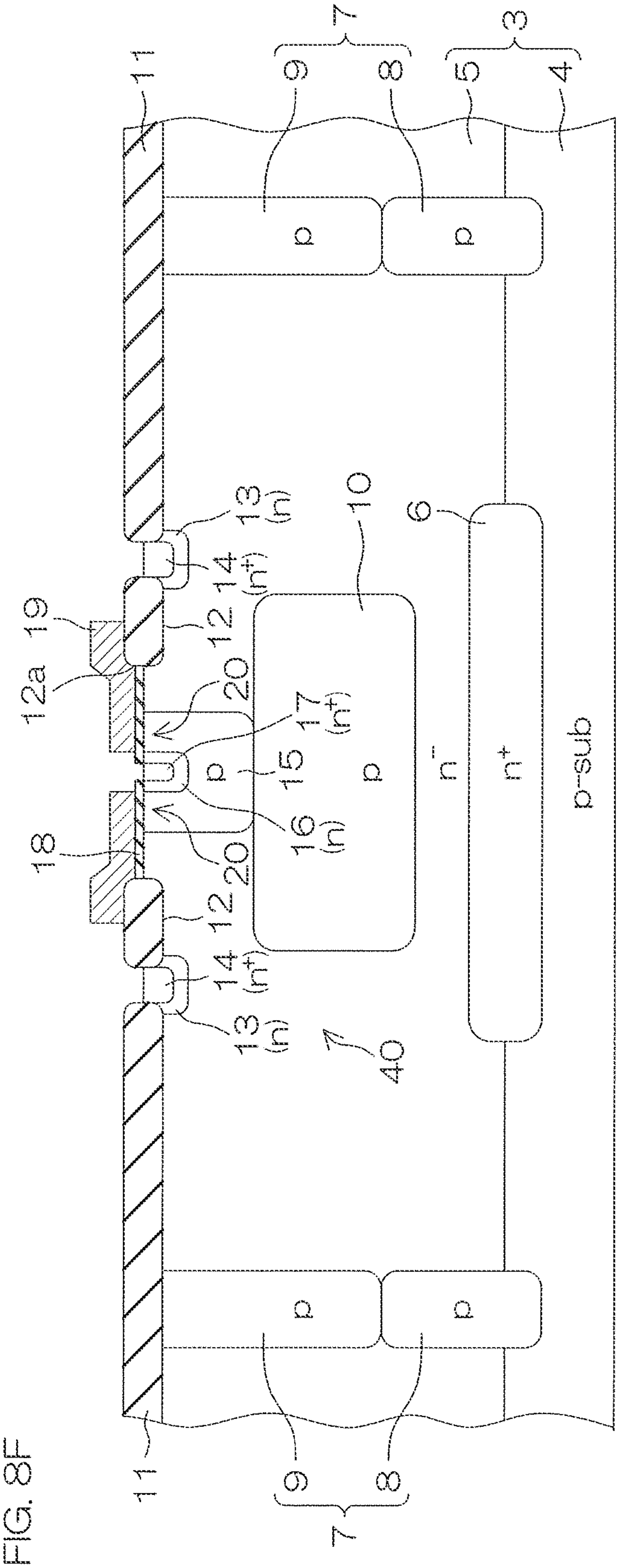
FIG. 8F is a sectional view of a step subsequent to that of FIG. 8E.

Next, as shown in FIG. 8F, the p type embedded layer 10 and the p type well region 15 are formed in the n-type epitaxial layer 5. To form the p type embedded layer 10 and the p type well region 15, first, an ion implantation mask (not shown) having an opening selectively in a region in which the p type well region 15 is to be formed is formed. The p type impurity is then implanted into the $n^-$ type epitaxial layer 5 via the ion implantation mask. By then performing a heat treatment, the p type well region 15 is formed in the surface layer portion of the $n^-$ type epitaxial layer 5 and the p type embedded layer 10 of wide width that spreads further outward than the p type well region 15 is formed below the p type well region 15. The ion implantation mask is thereafter removed.

Next, the n type drain region 13 is formed in the surface layer portion of the $n^-$ type epitaxial layer 5 and, at the same time, the n type source region 16 is formed in an inner region (surface layer portion) of the p type well region 15. To form the n type drain region 13 and the n type source region 16, first, an ion implantation mask (not shown) having openings selectively and respectively in a region in which the n type drain region 13 is to be formed and a region in which the n type source region 16 is to be formed is formed. The n type impurity is then implanted into the $n^-$ type epitaxial layer 5 via the ion implantation mask. The n type drain region 13 and the n type source region 16 are thereby formed. The ion implantation mask is thereafter removed.

Next, the $n^+$ type drain contact region 14 and the $n^+$ type source contact region 17 are selectively formed respectively in respective inner regions (surface layer portions) of the n type drain region 13 and the n type source region 16. To form the $n^+$ type drain contact region 14 and the $n^+$ type source contact region 17, first, an ion implantation mask (not shown) having openings selectively and respectively in regions in which the $n^+$ type drain contact region 14 and the $n^+$ type source contact region 17 are to be formed is formed. The n type impurity is then implanted into the n type drain region 13 and the n type source region 16 via the ion implantation mask. The $n^+$ type drain contact region 14 and the $n^+$ type source contact region 17 are thereby formed. The ion implantation mask is thereafter removed.

Figure 8G:
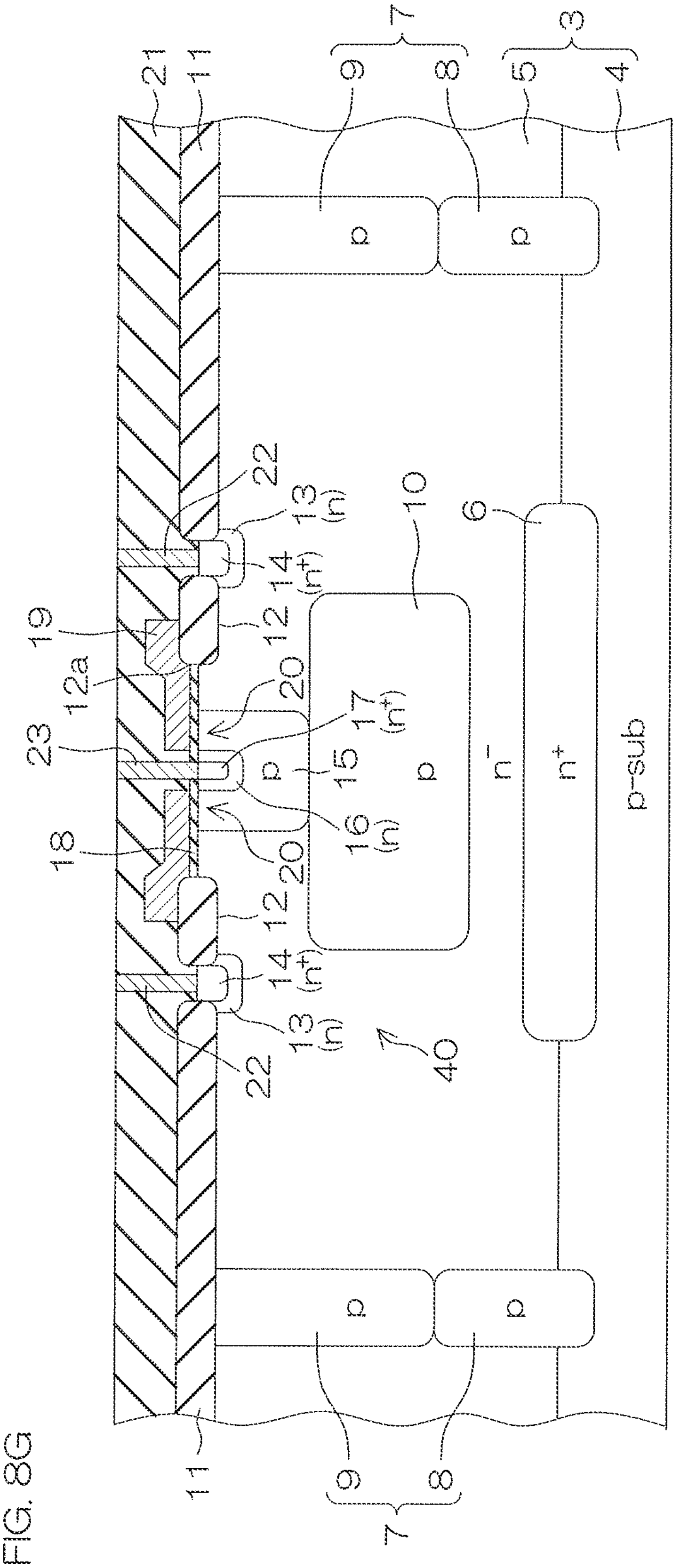
FIG. 8G is a sectional view of a step subsequent to that of FIG. 8F.

Next, as shown in FIG. 8G, an insulating material is deposited such as to cover the gate electrode 19 and the interlayer insulating film 21 is thereby formed. Next, the drain contact plugs 22, the source contact plugs 23, and the gate contact plugs 24 are formed such as to penetrate through the interlayer insulating film 21. The drain contact plugs 22, the source contact plugs 23, and the gate contact plugs 24 are electrically connected respectively to the $n^+$ type drain contact region 14, the $n^+$ type source contact region 17, and the gate electrode 19.

Lastly, the drain wiring 25, the source wiring 26, and the gate wiring (not shown) that are electrically connected respectively to the drain contact plugs 22, the source contact plugs 23, and the gate contact plugs 24 are selectively formed on the interlayer insulating film 21. To form the drain wiring 25, the source wiring 26, and the gate wiring, for example, a wiring material layer is formed on the interlayer insulating film 21. The drain wiring 25, the source wiring 26, and the gate wiring are then formed by selectively removing the wiring material layer by photolithography and etching. The semiconductor device 1A according to the second preferred embodiment is manufactured through the above steps.

Figure 9:
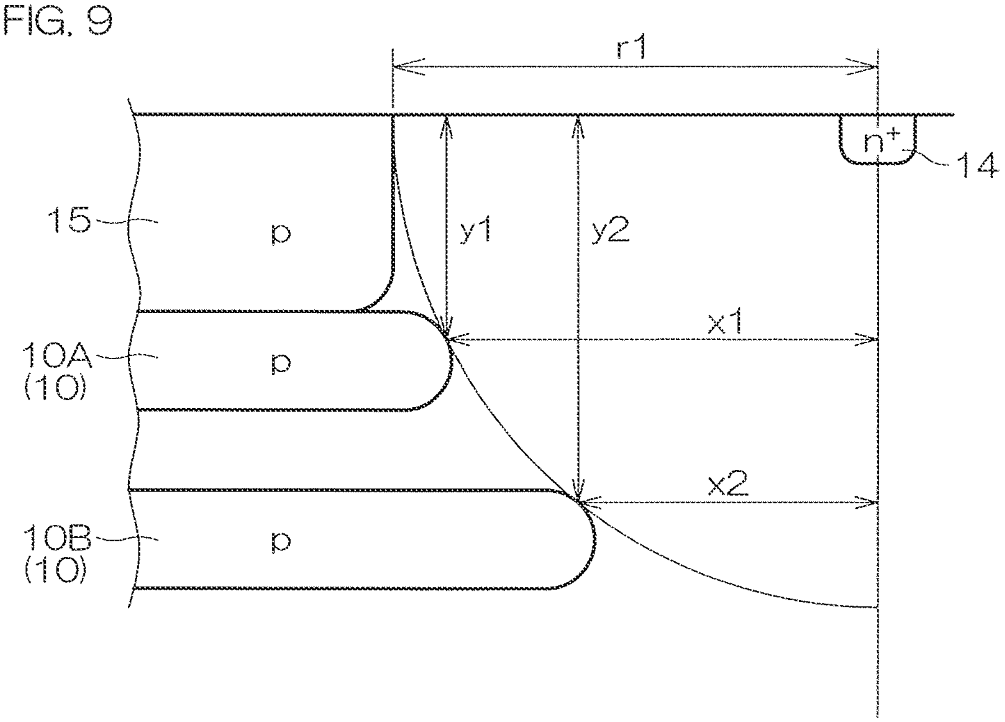
FIG. 9 is a schematic view for describing an example of a preferable positioning (lateral direction position and depth position) of a p type embedded layer with respect to positionings of a p type well region and an $n^+$ type drain contact region.

FIG. 9 is a schematic view for describing an example of a preferable positioning (lateral direction position and depth position) of the p type embedded layer 10 with respect to positionings of the p type well region 15 and the $n^+$ type drain contact region 14.

As described above, in the surface layer portion of the $n^-$ type epitaxial layer 5, the source-drain potential distribution tends to be uniform when the equipotential lines between the source and drain are substantially perpendicular with respect to the front surface of the n-type epitaxial layer 5.

To make the equipotential lines between the source and drain substantially perpendicular to the front surface of the $n^-$ type epitaxial layer 5, both end portions of the p type embedded layer 10 are preferably positioned at positions such as the following. That is, referring to FIG. 9, let r1 be a distance from a side edge at one side of the p type well region 15 to a width center of the $n^+$ type drain contact region 14 at an outer side thereof.

As with a p type embedded layer 10A or 10B shown in FIG. 9, a side edge portion at one side of a p type embedded layer corresponding to the side edge at one side of the p type well region 15 is preferably positioned such as to be tangent to a circle of the radius r1 centered at the width center of the $n^+$ type drain contact region 14 in a perpendicular section taken along the lateral direction as with the p type embedded layer indicated by 10A or 10B of FIG. 9.

Although not illustrated, the same applies to a side edge portion at the other side of the p type embedded layer 10. That is, let r2 be a distance from a side edge at the other side of the p type well region 15 to a width center of the $n^+$ type drain contact region 14 at an outer side thereof. A side edge portion at the other side of the p type embedded layer 10 is preferably positioned such as to be tangent to a circle of the radius r2 centered at the width center of the $n^+$ type drain contact region 14 in the perpendicular section taken along the lateral direction. Here, the radius r1 and the radius r2 are substantially equal.

Although the first and second preferred embodiments of the present invention have been described above, the present invention may be implemented in yet other preferred embodiments. In each of the preferred embodiments described above, just one p type embedded layer 10 is formed in the $n^-$ type epitaxial layer 5. However, two or more p type embedded layers 10 may instead be disposed in the n-type epitaxial layer 5 at intervals in a thickness direction of the $n^-$ type epitaxial layer 5. In this case, for example, the p type embedded layer 10A and the p type embedded layer 10B such as shown in FIG. 9 may be formed in the $n^-$ type epitaxial layer 5.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2020-44369 filed on Mar. 13, 2020 in the Japan Patent Office, and the entire disclosure of this application is incorporated herein by reference.

REFERENCE SIGNS LIST

- 1, 1A semiconductor device
- 2 element region
- 3 base body
- 4 p type semiconductor substrate
- 5 $n^-$ type epitaxial layer
- 6 $n^+$ type embedded layer
- 7 p type element isolation region
- 8 lower isolation region
- 9 upper isolation region
- 10 p type embedded layer
- 11 field insulating film
- 12 field insulating film
- 13 n type drain region
- 14 $n^+$ type drain contact region
- 15 p type well region
- 16 n type source region
- 17 $n^+$ type source contact region
- 18 gate insulating film
- 19 gate electrode
- 20 channel region
- 21 interlayer insulating film
- 22 drain contact plug
- 23 source contact plug
- 24 gate contact plug
- 25 drain wiring
- 26 source wiring
- 40 DMOS transistor
- 51 hard mask
- 52 polysilicon layer

The invention claimed is:

1. A semiconductor device comprising:

a p type substrate;

an n type semiconductor layer that is formed on the p type substrate; and a transistor with the n type semiconductor layer as a drain, wherein the transistor includes:

a p type well region that is formed in a surface layer portion of the n type semiconductor layer, an n type source region that is formed in a surface layer portion of the p type well region and is higher in n type impurity concentration than the n type semiconductor layer, an n type source contact region that is formed in a surface layer portion of the n type source region, and is higher in the n type impurity concentration than the n type source region, an n type drain region that is disposed at an interval from the p type well region and is higher in the n type impurity concentration than the n type semiconductor layer, and an n type drain contact region that is formed in the surface layer portion of the n type semiconductor layer, in a surface layer portion of the n type drain region, and is higher in the n type impurity concentration than the n type drain region, the n type drain contact region being disposed at an interval from the p type well region, and wherein inside the n type semiconductor layer, a p type embedded layer is formed below the p type well region.

2. The semiconductor device according to claim 1, further comprising an n type embedded layer that is formed in a boundary portion between the p type substrate and the n type semiconductor layer and is higher in impurity concentration than the n type semiconductor layer.

3. The semiconductor device according to claim 1, wherein a width of the p type embedded layer is greater than a width of the p type well region and in plan view, both sides of the p type embedded layer projecting outward from both sides of the p type well region.

4. The semiconductor device according to claim 3, wherein the n type drain region and the n type drain contact region are formed to surround the p type well region in plan view.

5. The semiconductor device according to claim 1, wherein the p type embedded layer is disposed separately from the p type well region.

6. The semiconductor device according to claim 1, wherein the p type embedded layer is connected to the p type well region.

7. The semiconductor device according to claim 1, wherein the p type embedded layer includes a plurality of p type embedded layers that are disposed at intervals in an up/down direction.

8. The semiconductor device according to claim 1, wherein the transistor further includes a gate insulating film that is formed to cover a channel region between the source contact region and the drain contact region, and a gate electrode that is formed on the gate insulating film and opposes the channel region via the gate insulating film.

9. The semiconductor device according to claim 8, comprising: a source wiring that is electrically connected to the n type source contact region and a drain wiring that is electrically connected to the n type drain contact region.

10. The semiconductor device according to claim 1, wherein the n type drain region and the n type drain contact region are formed to endless shapes such as to surround the p type well region in plan view.

11. The semiconductor device according to claim 10, wherein the p type embedded layer is disposed inside a region that is surrounded by the n type drain contact region in plan view.

12. The semiconductor device according to claim 1, wherein a p type impurity concentration of the p type embedded layer is not less than $1.0\times10^{16}$ $cm^{-3}$ and not more than $1.0\times10^{18}$ $cm^{-3}$.

13. A method for manufacturing semiconductor device comprising:

a step of selectively implanting an n type impurity into a front surface of a p type semiconductor substrate and thereafter forming a first n type epitaxial layer on the front surface of the p type semiconductor substrate to form an n type embedded layer that extends across a boundary between the p type semiconductor substrate and the first n type epitaxial layer;

a step of selectively implanting a p type impurity into a front surface of the first n type epitaxial layer and thereafter forming a second n type epitaxial layer on the front surface of the first n type epitaxial layer to form a p type embedded layer just in a surface layer of the first n-type epitaxial layer, among an n-type epitaxial layer composed of the first n-type epitaxial layer and the second n-type epitaxial layer;

a step of forming, in a surface layer portion of the second n type epitaxial layer, a p type well layer that is disposed above the p type embedded layer;

a step of forming, in a surface layer portion of the p type well layer, an n type source contact region that is higher in impurity concentration than the second n type epitaxial layer and forming, in the surface layer portion of the second n type epitaxial layer, an n type drain contact region that is higher in impurity concentration than the second n type epitaxial layer;

a step of forming, on a front surface of the second n type epitaxial layer, a gate insulating film to cover a channel region between the source contact region and the drain contact region, and a step of forming, on the gate insulating film, a gate electrode that opposes the channel region via the gate insulating film.

14. The method for manufacturing semiconductor device according to claim 13, wherein in the step of forming the p type embedded layer, the p type embedded layer is formed across a boundary between the first n type epitaxial layer and the second n type epitaxial layer.

* * * * *